US012013449B2

(12) United States Patent
Chen et al.

(10) Patent No.: US 12,013,449 B2
(45) Date of Patent: Jun. 18, 2024

(54) MULTI-FREQUENCY HIGH ELECTRIC FIELD SYSTEMS FOR MAGNETIC RESONANCE IMAGING SAFETY TESTING OF MEDICAL DEVICES

(71) Applicant: University of Houston System, Houston, TX (US)

(72) Inventors: Ji Chen, Sugar Land, TX (US); Jianfeng Zheng, Sugar Land, TX (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 17/549,503

(22) Filed: Dec. 13, 2021

(65) Prior Publication Data

US 2022/0187391 A1    Jun. 16, 2022

Related U.S. Application Data

(60) Provisional application No. 63/125,183, filed on Dec. 14, 2020.

(51) Int. Cl.
| | |
|---|---|
| *G01R 33/28* | (2006.01) |
| *G01N 25/00* | (2006.01) |
| *H03F 1/56* | (2006.01) |
| *H03F 3/20* | (2006.01) |

(52) U.S. Cl.
CPC .......... *G01R 33/288* (2013.01); *G01N 25/00* (2013.01); *H03F 1/565* (2013.01); *H03F 3/20* (2013.01); *H03F 2200/387* (2013.01)

(58) Field of Classification Search
None
See application file for complete search history.

(56) References Cited

U.S. PATENT DOCUMENTS

| | | | |
|---|---|---|---|
| 2016/0220828 A1* | 8/2016 | Yan Poon | H02J 50/20 |
| 2020/0230423 A1* | 7/2020 | Chen | A61N 1/3718 |

OTHER PUBLICATIONS

Wang, Yu, Shuo Song, Jianfeng Zheng, Qingyan Wang, Stuart A. Long, Wolfgang Kainz, and Ji Chen. "A novel device model validation strategy for 1.5 T and 3 T MRI heating safety assessment." IEEE Transactions on Instrumentation and Measurement (Sep. 2020).

(Continued)

*Primary Examiner* — Erica S Lin
(74) *Attorney, Agent, or Firm* — Shackelford, McKinley & Norton, LLP

(57) ABSTRACT

In an embodiment, the present disclosure pertains to electric field generators that include a signal generator electrically connected to a power amplifier, a impedance matching circuit electrically connected to the power amplifier, and a power divider electrically connected to the impedance matching circuit and to at least one of a first wall, a second wall, a third wall, a fourth wall, or a base area. In an additional embodiment, the present disclosure pertains to method of determining radio frequency (RF)-induced heating on a medical device utilizing an electric field generator of the present disclosure. Additional embodiments of the present disclosure pertain to methods of making electric field generators for testing a medical device.

9 Claims, 31 Drawing Sheets

(56) References Cited

OTHER PUBLICATIONS

Song, Shuo, Jianfeng Zheng, Yu Wang, Qingyan Wang, Wolfgang Kainz, Stuart A. Long, and Ji Chen. "Dual-Frequency High-Electric-Field Generator for MRI Safety Testing of Passive Implantable Medical Devices." IEEE Transactions on Microwave Theory and Techniques 68, No. 12 (2020): 5423-5431.

Song et al., "A Novel Device Model Validation System for 1.5T and 3T MRI Safety Assessment", 2019 Photonics & Electromagnetics Research Symposium—Fall (PIERS—Fall), Dec. 18, 2019.

Song et al., "Multi-Frequency High Electric Field System for MRI Safety Test of Implantable Medical Devices", presented at the University of Hawaii on Nov. 7, 2019.

Chen et al., "On the AIMD Model Validation for MR RF Safety Assessment", presented on Nov. 11, 2019 to ISO10974 standard committee members. Prague, Czech Republic.

* cited by examiner

PATHWAY M1

PATHWAY M2

PATHWAY M3

PATHWAY M4

PATHWAY M5

PATHWAY M6

PATHWAY M7

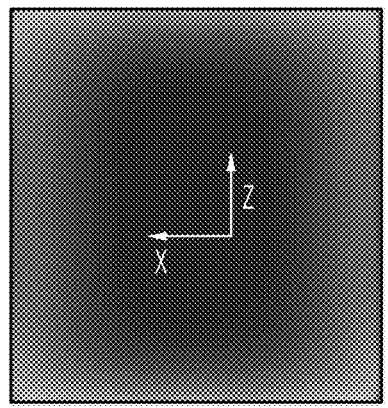  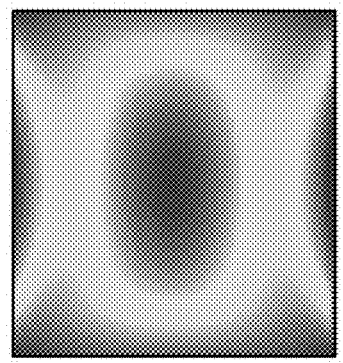 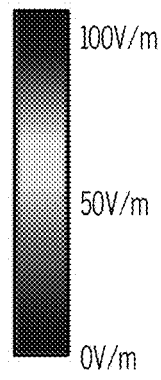
FIG. 15A				FIG. 15B
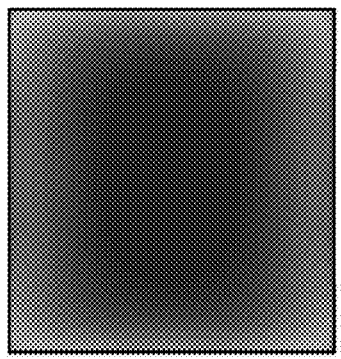 = 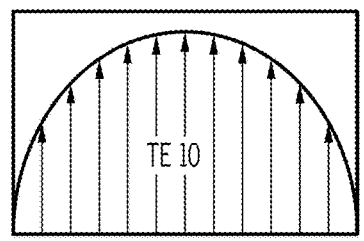
FIG. 15C
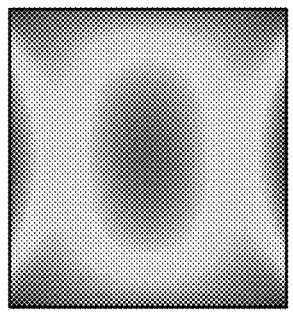 = 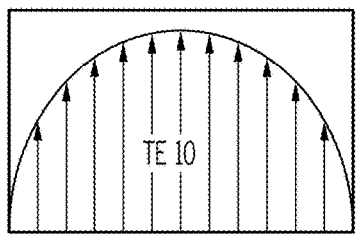 + 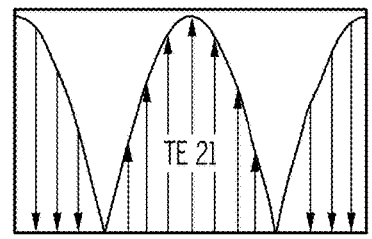
FIG. 15D

MULTI-FREQUENCY HIGH ELECTRIC FIELD SYSTEMS FOR MAGNETIC RESONANCE IMAGING SAFETY TESTING OF MEDICAL DEVICES

CROSS-REFERENCE TO RELATED APPLICATIONS

This application claims priority to U.S. Provisional Patent Application No. 63/125,183, filed on Dec. 14, 2020. The entirety of the aforementioned application is incorporated herein by reference.

STATEMENT REGARDING FEDERALLY SPONSORED RESEARCH

This invention was made with government support under 1440107 and 1922389 awarded by the National Science Foundation. The government has certain rights in the invention.

BACKGROUND

Magnetic resonance imaging (MRI) examination is a common procedure used in the medical industry today. For patients implanted with an implantable medical device, such as a neuro-stimulator or a deep brain stimulator, there is an increased demand to undergo MRI scanning. Since these devices often have long and insulated electrodes (lead body), they can act as a receiving antenna to collect the radio frequency (RF)-induced energy generated by the MRI RF coil and deposit the collected energy into the human tissue at the tip electrodes. Consequently, these localized energy depositions can lead to temperature rises near the tip electrode and may cause tissue damage.

SUMMARY

In an embodiment, the present disclosure pertains to an electric field generator, that can be used for example, to test a medical device, such as an implantable medical device. In some embodiments, the electric field generator includes a first wall, a second wall, a third wall, and a fourth wall that form an enclosed shape having a cavity therein for housing a medical device. In some embodiments, the first wall and the second wall are on opposite sides of one another. In some embodiments, the third wall and the fourth wall are on opposite sides of one another. In some embodiments, the first wall and the second wall are spaced apart via the third wall and the fourth wall. In some embodiments, the first wall and the second wall intersect with the third wall and the fourth wall to form the enclosed shape. In some embodiments, the electric field generator includes a base area at the bottom of the enclosed shape. In some embodiments, the electric field generator further includes a power divider electrically connected to at least one of the first wall, the second wall, the third wall, the fourth wall, or the base area. In some embodiments, the power divider is electrically connected to an impedance matching circuit. In some embodiments, the impedance matching circuit is electrically connected to a power amplifier. In some embodiments, the power amplifier is electrically connected to a signal generator.

In an embodiment, the present disclosure pertains to a method of determining RF-induced heating on a medical device. In some embodiments, the method includes one or more of the following steps of: (1) determining a validation pathway; (2) incorporating the validation pathway on a grid in an electric field generator; (3) incorporating the medical device in a central slice of a conductive composition within the electric field generator; (4) applying power to the electric field generator; (5) generating a uniform electric field within the electric field generator, such that the uniform electric field induces RF-heating within the medical device; and (6) measuring a change in temperature of the medical device. In some embodiments, the methods of the present disclosure may be utilized to develop and validate a medical device electromagnetic model for RF-induced heating. Additional embodiments of the present disclosure pertain to methods of making electric field generators for testing a medical device.

DESCRIPTION OF THE DRAWINGS

FIG. 2A shows the resonator structure working at both 64 MHz and 128 MHz, and FIG. 2B shows the entire system configuration.

FIG. 6A shows magnitude and (FIG. 6B) phase of the transfer function of a 40 cm AIMD. FIG. 6C shows magnitude and (FIG. 6D) phase of the transfer function of a 30 cm AIMD.

FIG. 8A shows 1.5 T tangential electric field magnitude and (FIG. 8B) phase. FIG. 8C shows 3T tangential electric field magnitude and (FIG. 8D) phase.

Figure 5:
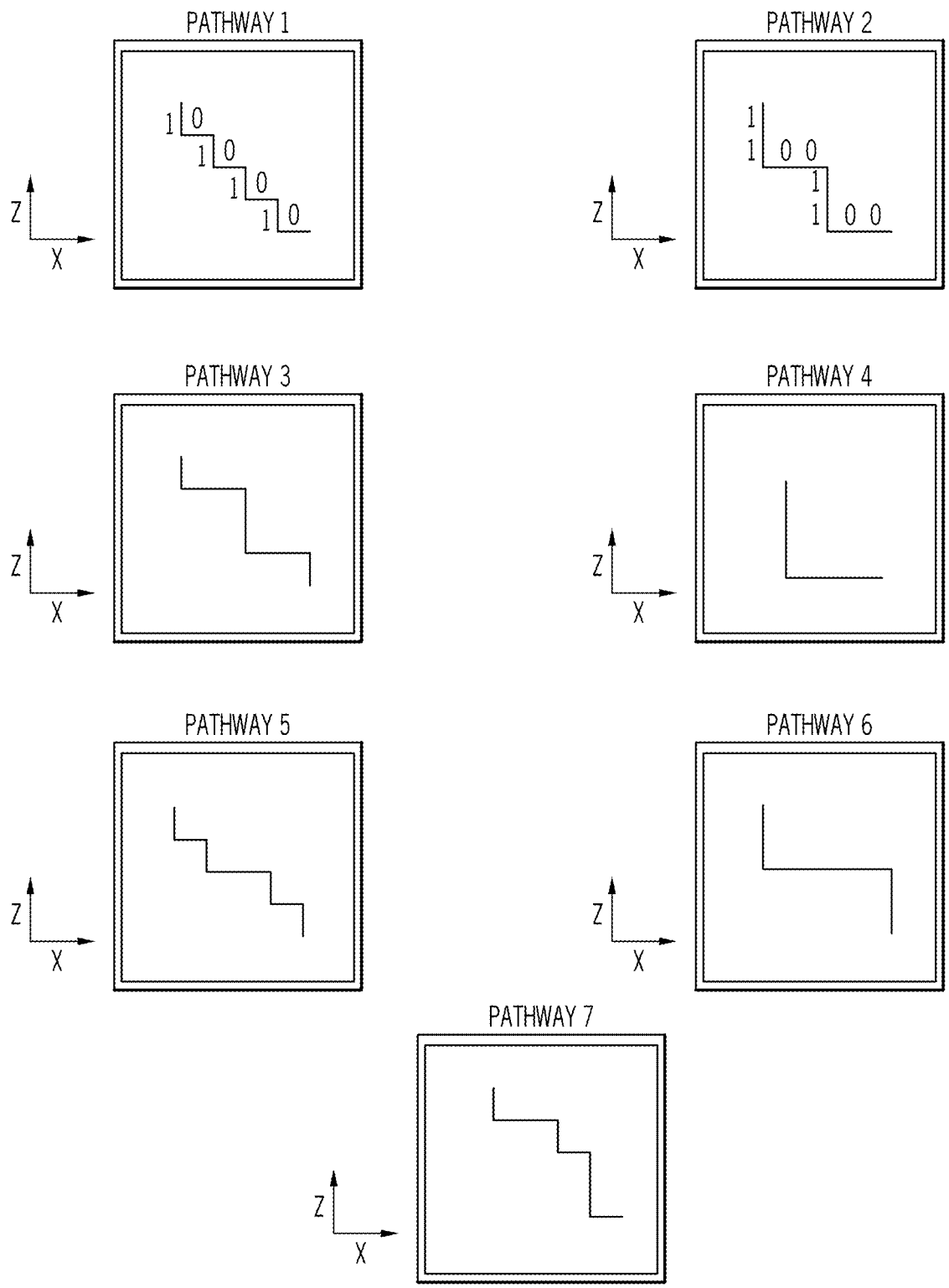
FIG. 5 illustrates the newly designed pathways following the revised matrix.
Figure 6A:
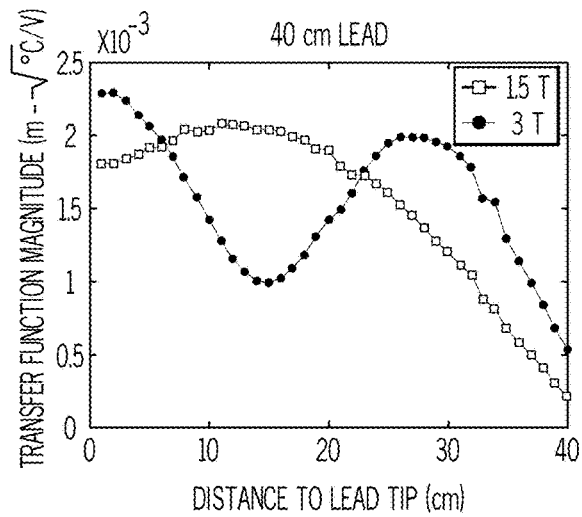
FIGS. 6A-6D illustrate the measured transfer functions (device electromagnetic heating models) of two example active implantable medical devices (AIMDs) for both 1.5 T (64 MHz) and 3 T (128 MHz).
Figure 6B:
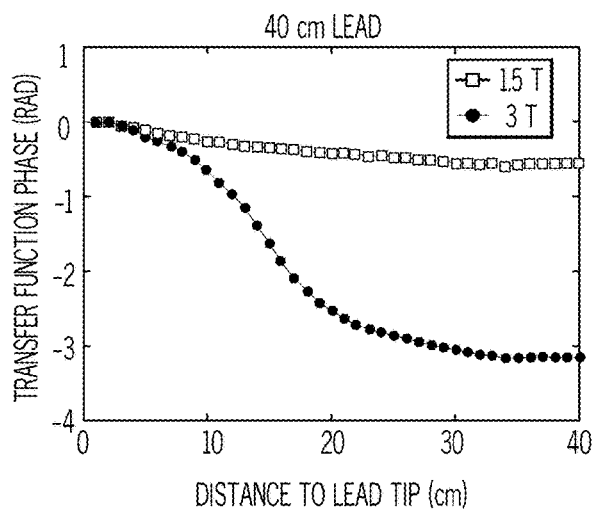
Figure 6C:
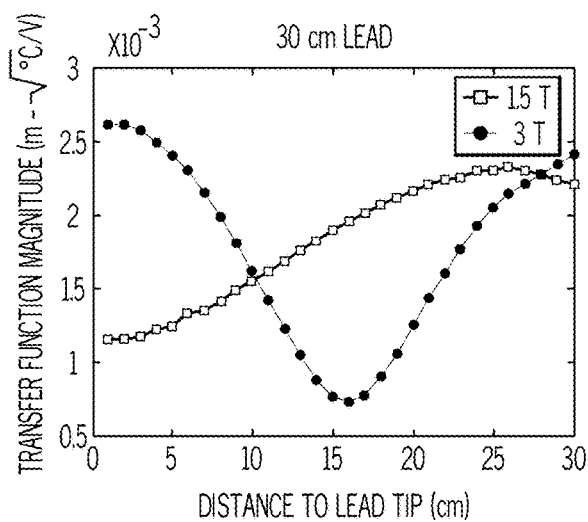
Figure 6D:
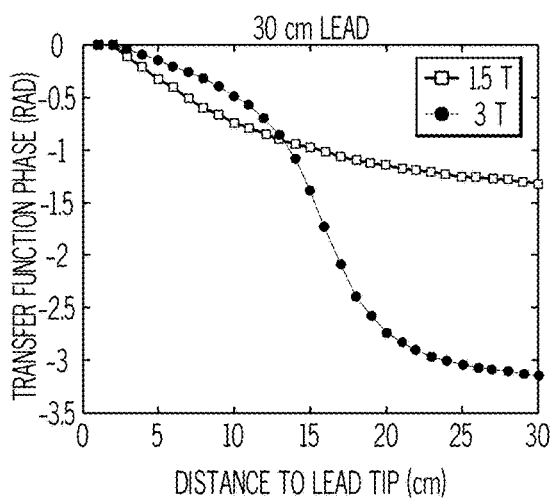
Figure 10A:
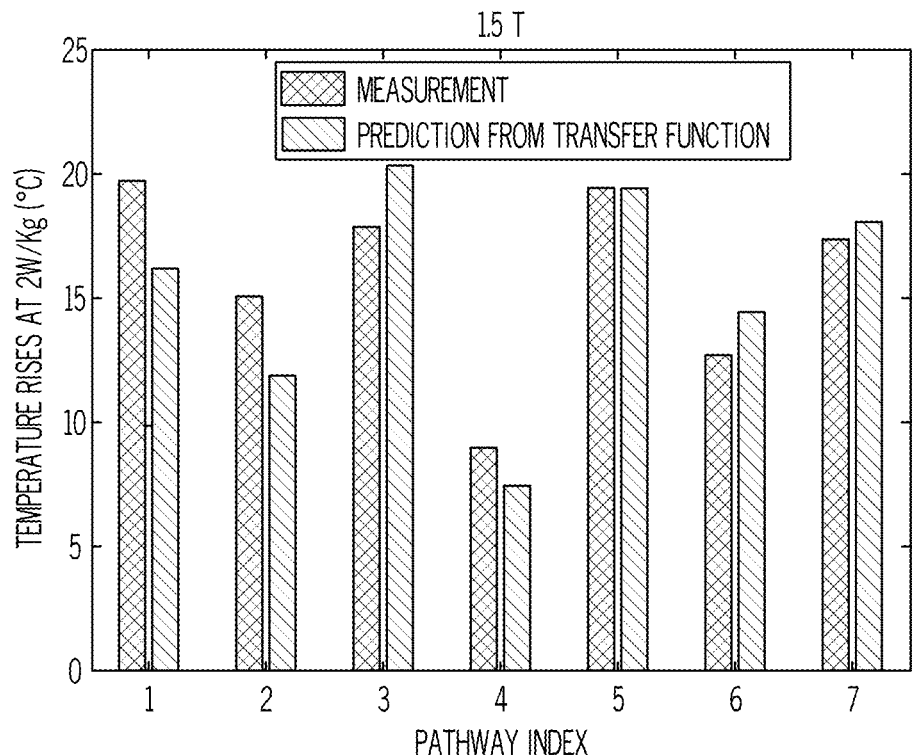
FIGS. 10A-10B illustrate comparison of temperature rises at the lead tip electrode derived from measurement and the prediction by transfer function for the 30 cm AIMD. FIG.
Figure 10B:
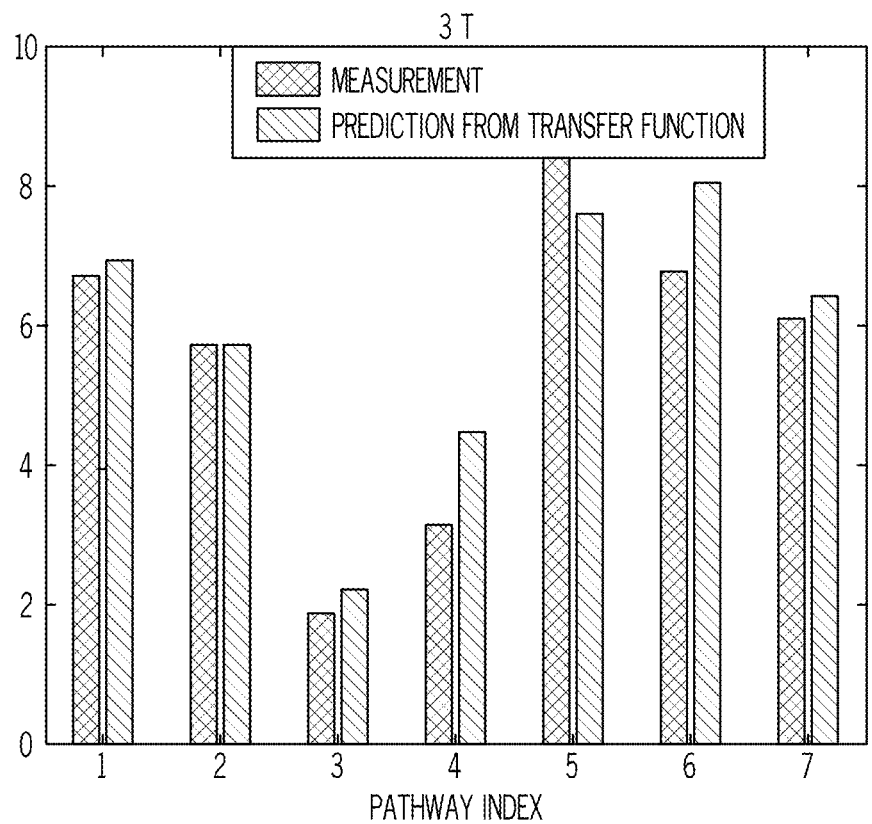
Figure 11:
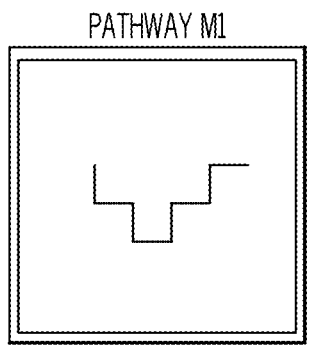
Figure 11:
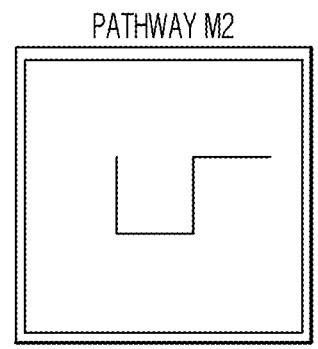
Figure 11:
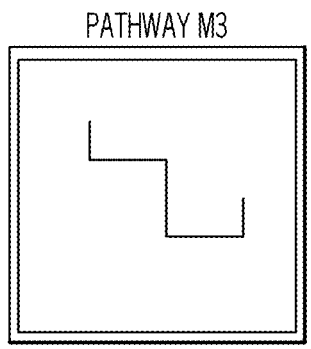
Figure 11:
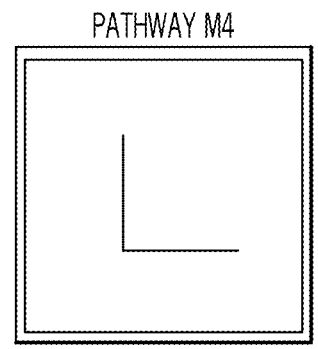
Figure 11:
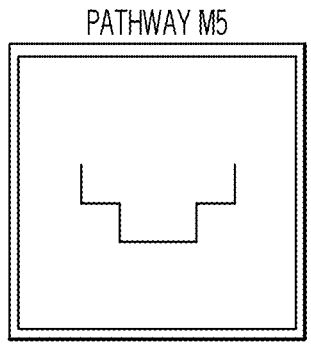
Figure 11:
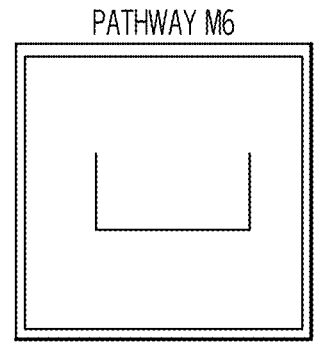
Figure 11:
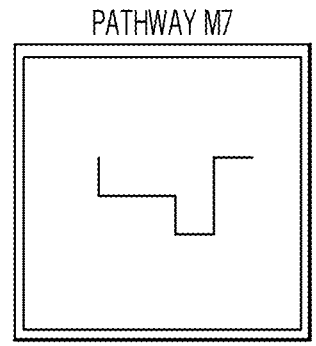

10A shows 1.5 T using the prototype pathways in FIG. 5 and (FIG. 10B) 3 T using the modified pathway shown in FIG. 11.

FIG. 11 illustrates modified validation pathways for the 30 cm AIMD in the 3 T test.

Figure 12A:
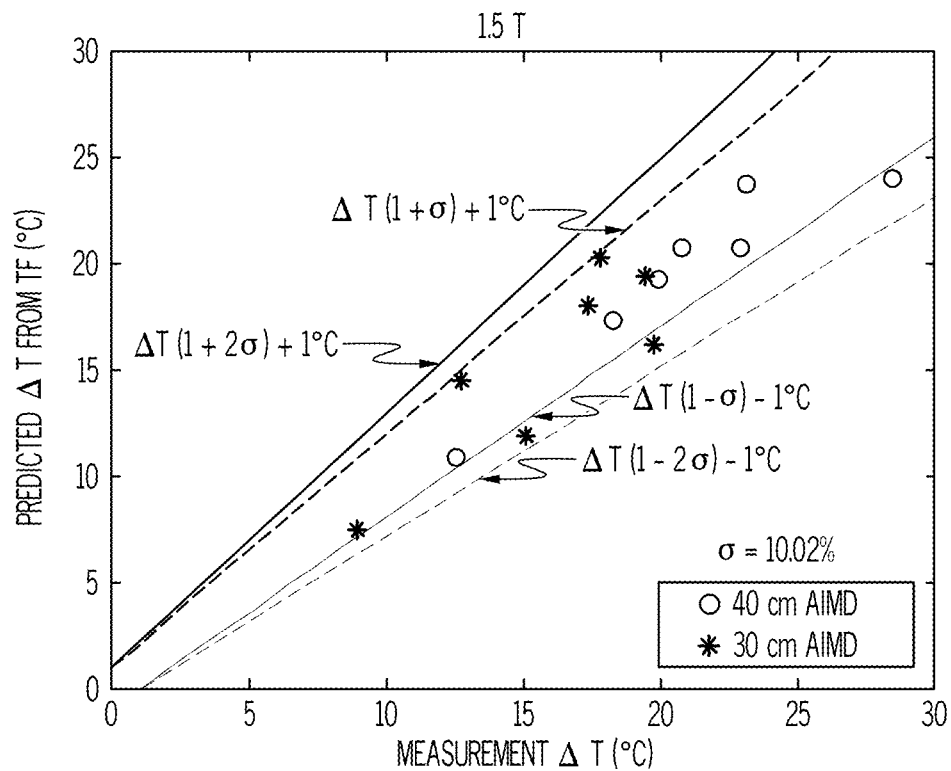
Figure 12B:
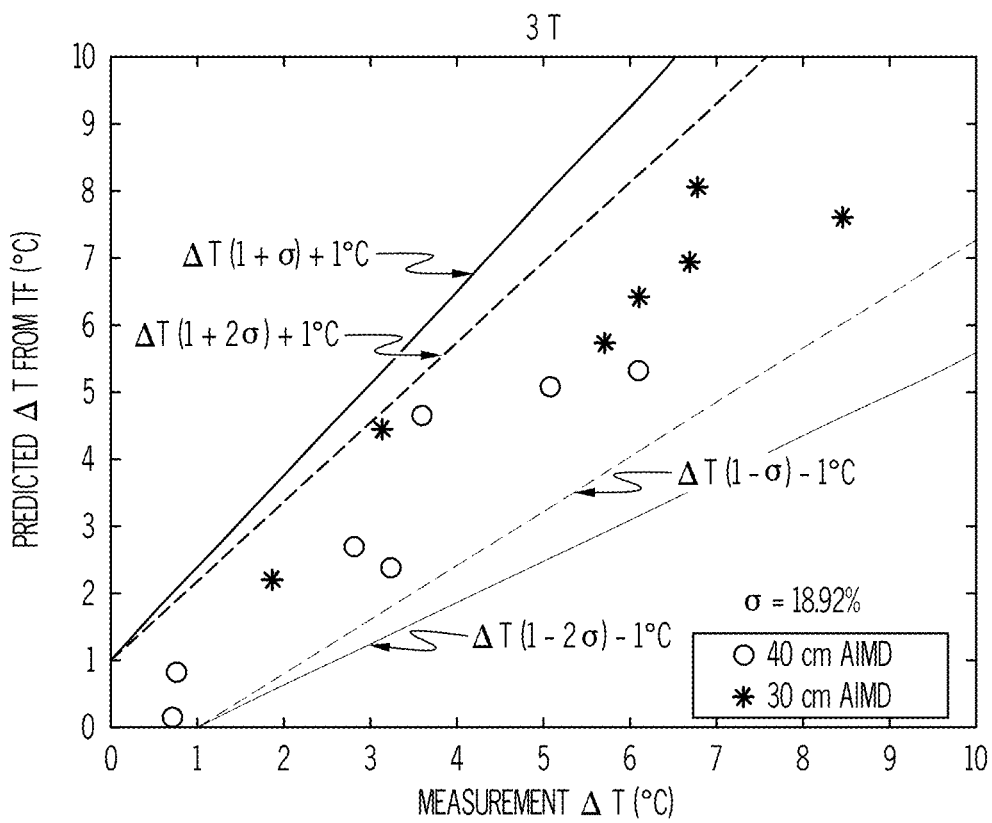

FIGS. 12A-12B illustrate measured and predicted temperature rises for both AIMDs together with the uncertainty boundary for (FIG. 12A) 1.5 T and (FIG. 12B) 3 T.

Figure 13:
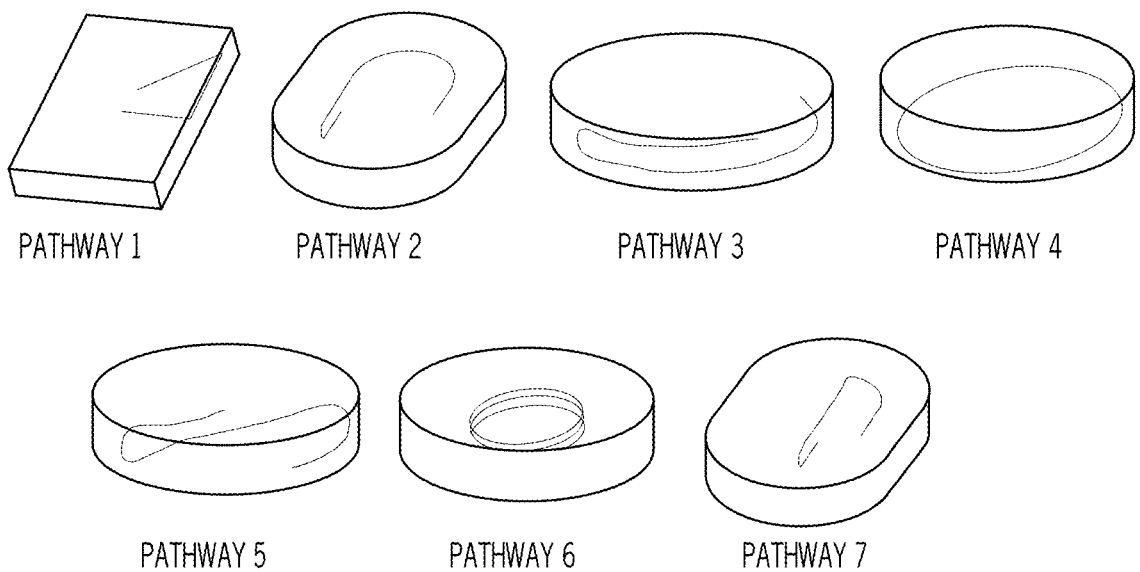

FIG. 13 illustrates the recommended validation pathways for AIMDs by ISO 10974.

Figure 14A:
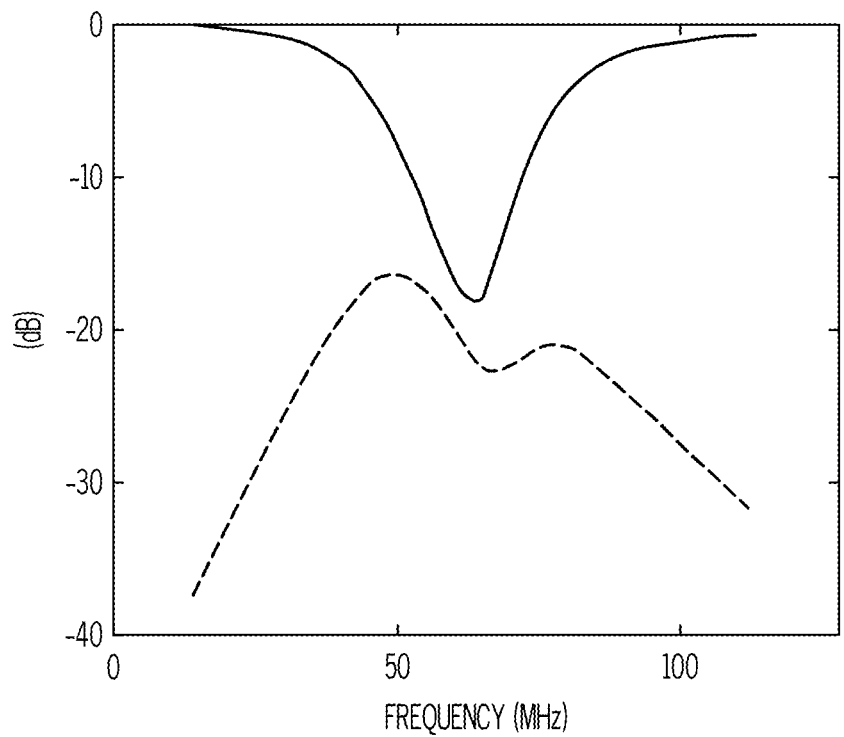
Figure 14B:
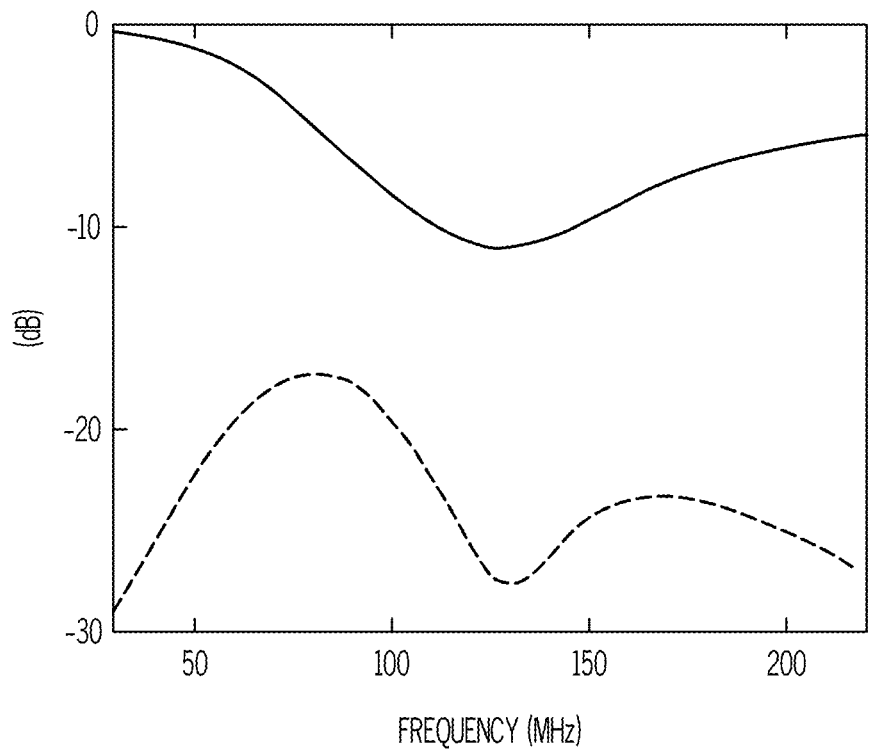

FIGS. 14A-14B illustrate S parameters of the E-field generator for (FIG. 14A) 1.5T (64 MHz) and (FIG. 14B) 3T (128 MHz). Solid line for $S_{11}$, and dotted line for S21.

FIGS. 15A-15D illustrates E-field distribution at the center slice of gel based on numerical simulation. FIG. 15A shows the electric field along the z-direction solved using the numerical method for 64 MHz. FIG. 15B shows the electric field along z-direction solved using the numerical method at 128 MHz. FIG. 15C shows single mode at 64 MHz. FIG. 15D shows hybrid modes of 3T.

Figure 16:
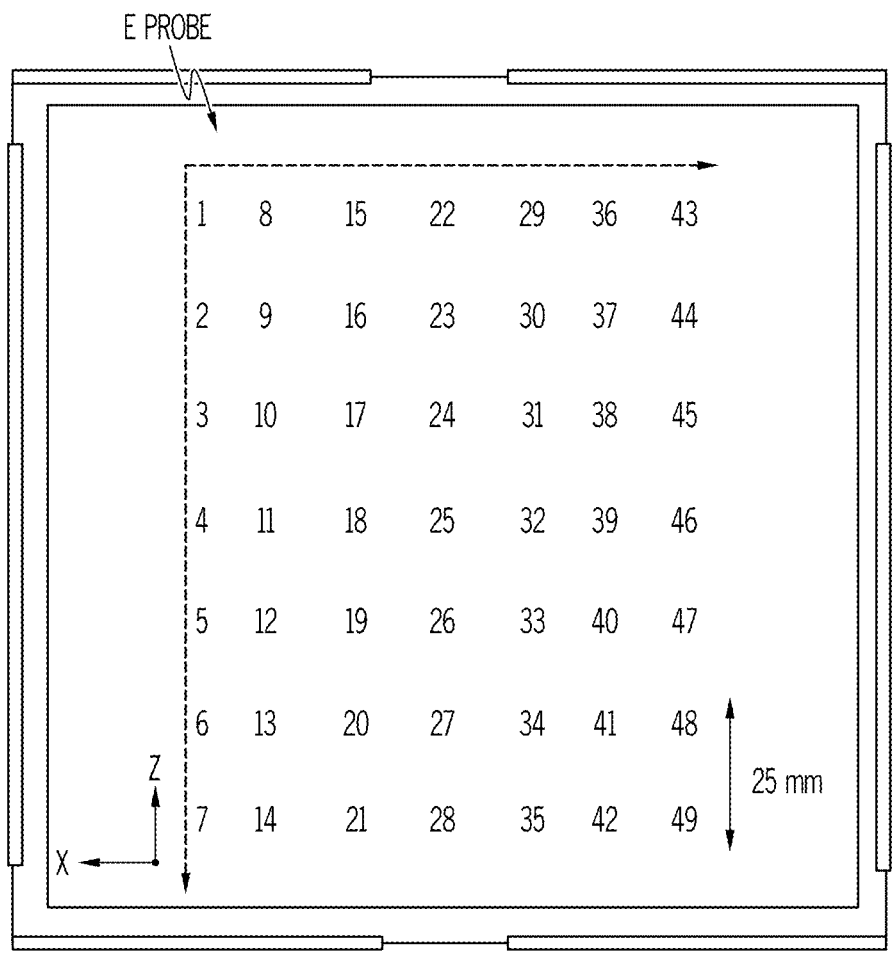

FIG. 16 illustrates experimental validation of the E-field distribution using an E-field probe at different locations of the generator.

Figure 17A:
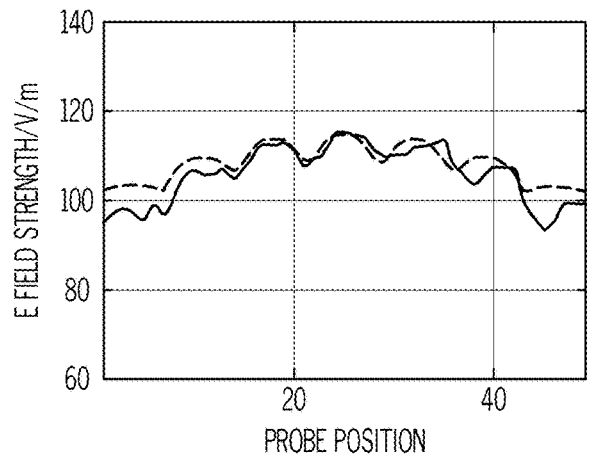
Figure 17B:
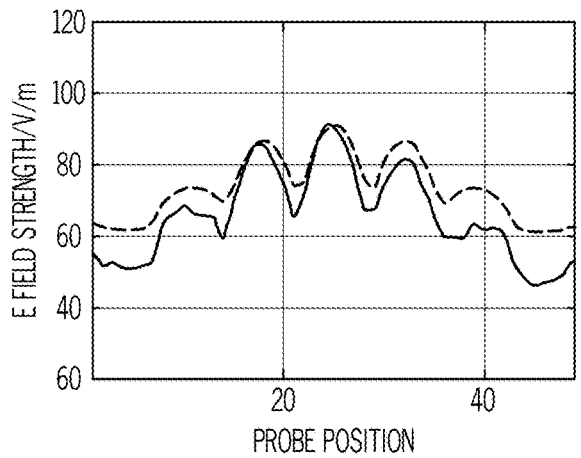
Figure 17C:
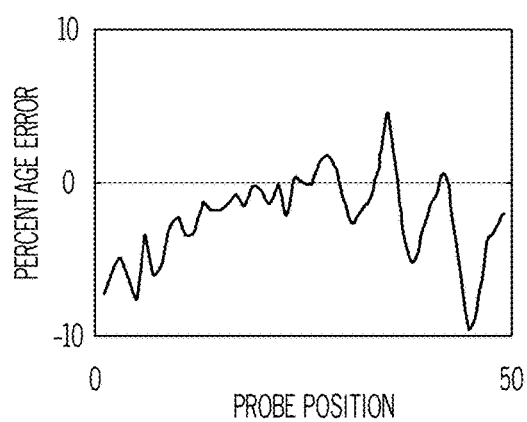
Figure 17D:
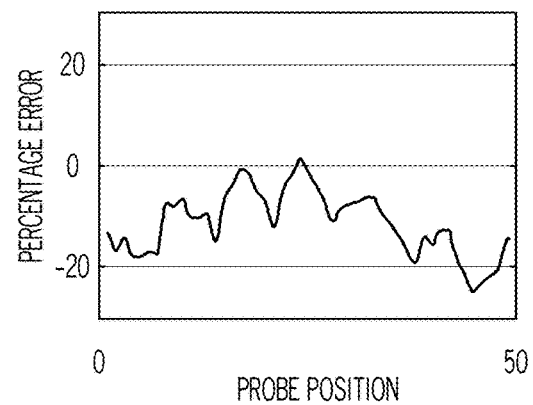

FIGS. 17A-17D illustrate comparison of measured and calculated E-field inside the generator at 49 locations. FIG. 17A shows E-field at 64 MHz, FIG. 17B shows E-field at 128 MHz. The Blue lines are the simulation and the Red lines are the experimental results. FIG. 17C and FIG. 17D show the relative errors for 64 MHz and 128 MHz, respectively.

Figure 18:
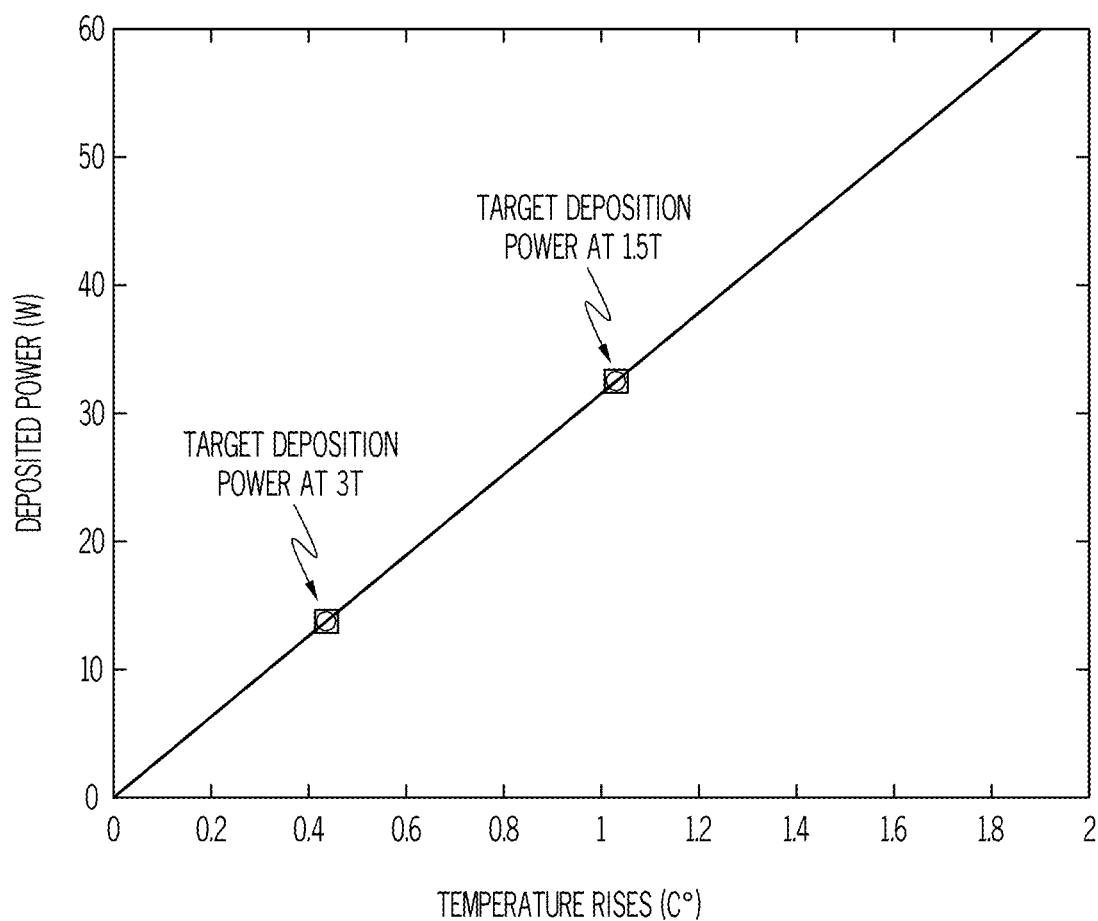

FIG. 18 illustrates a calibration curve to estimate the input power based on calorimetry method.

Figure 19A:
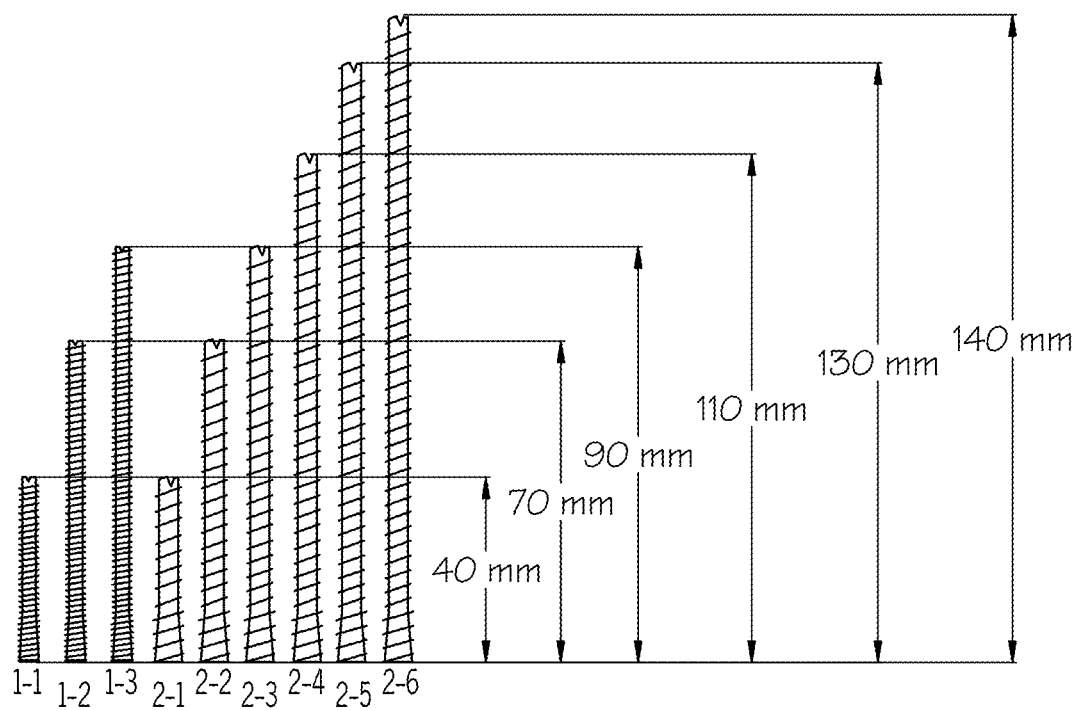
Figure 19B:
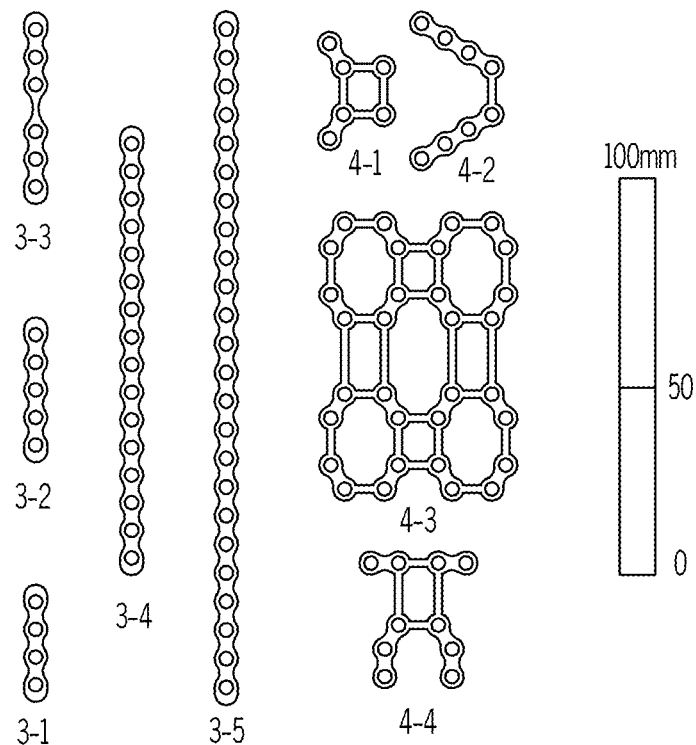

FIGS. 19A-19B illustrate simulation models of (FIG. 19A) standalone screws and (FIG. 19B) a plate system family.

Figure 20A:
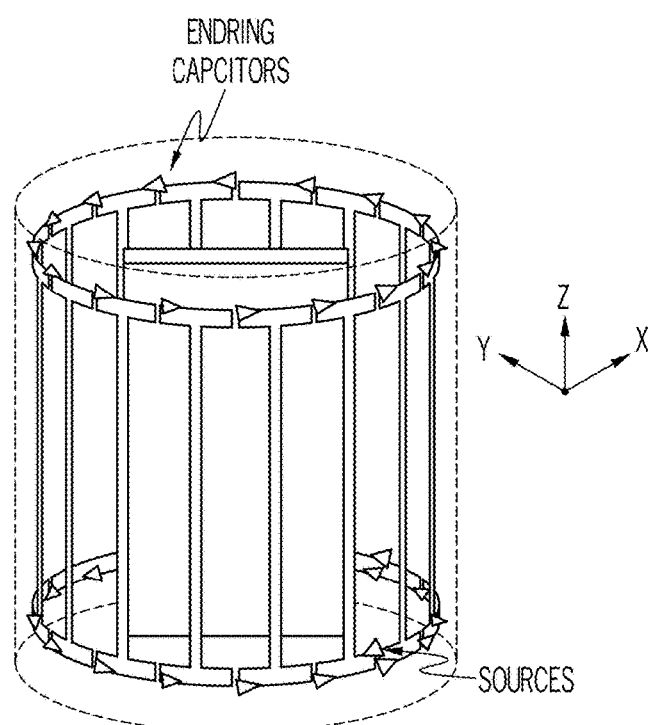
Figure 20B:
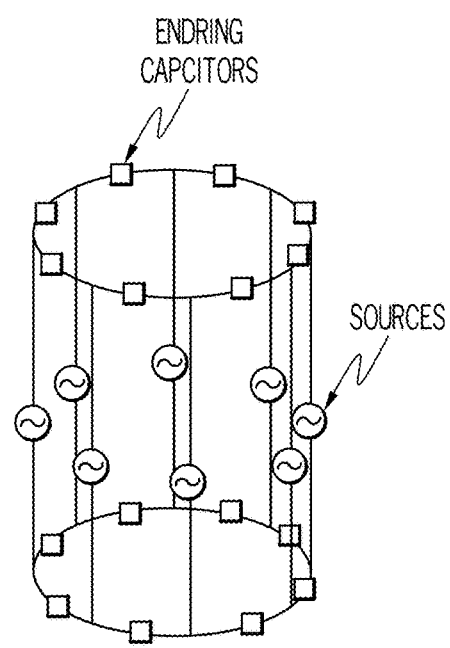

FIGS. 20A-20B illustrate (FIG. 20A) a typical bird cage coil used for magnetic resonance imaging (MRI) scanning (FIG. 20B) simplified generic coil H8 (hybrid 8-port generic coil).

Figure 21A:
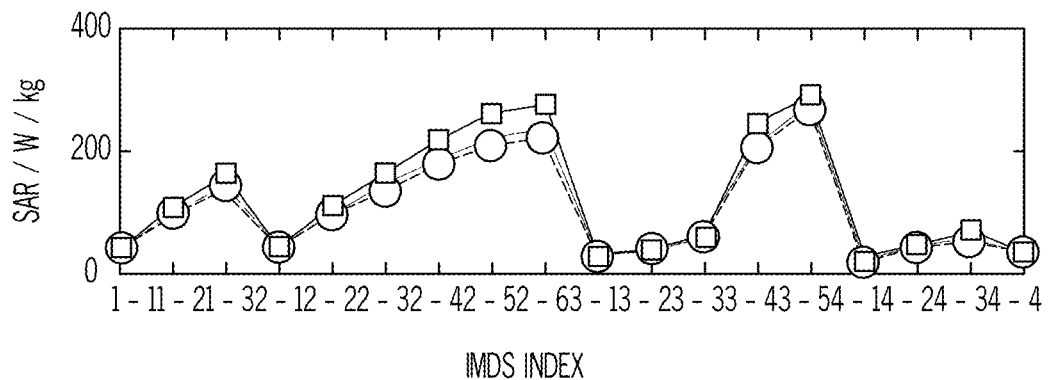
Figure 21B:
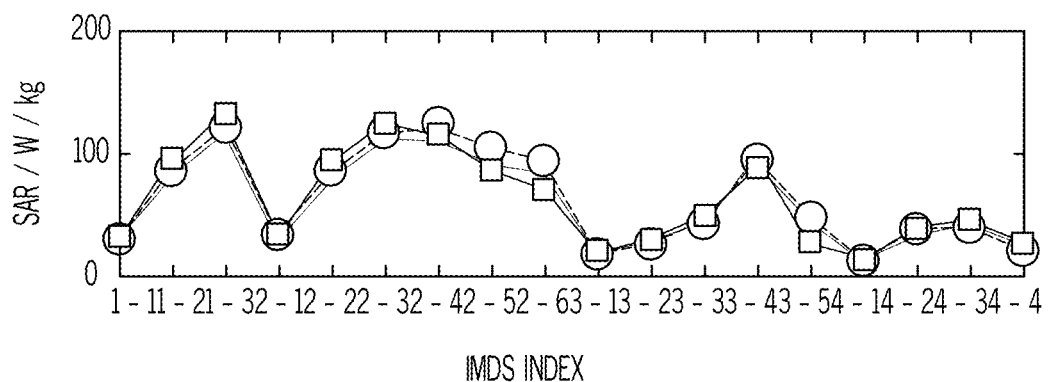
Figure 22A:
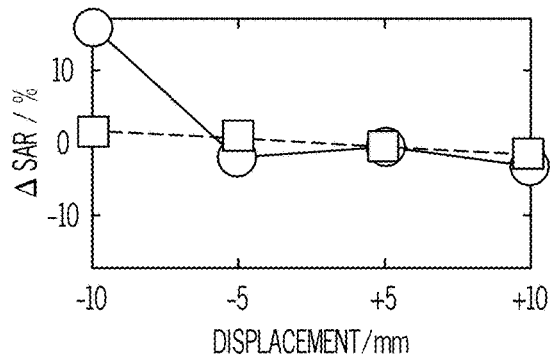
Figure 22B:
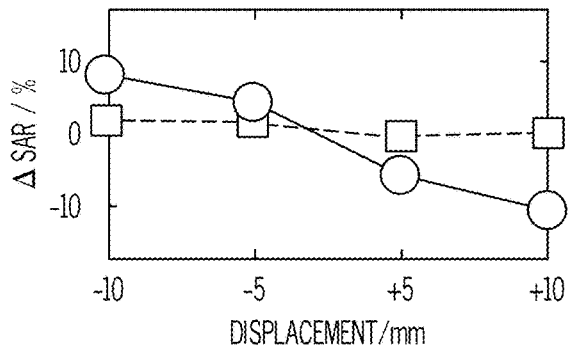
Figure 22C:
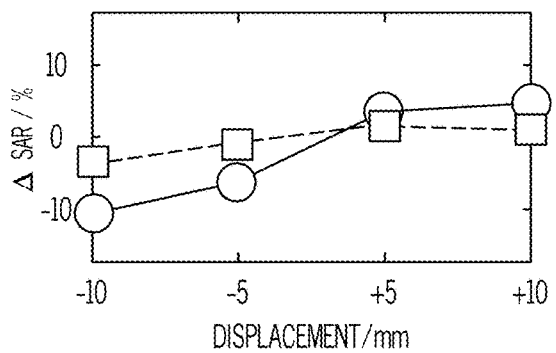
Figure 22D:
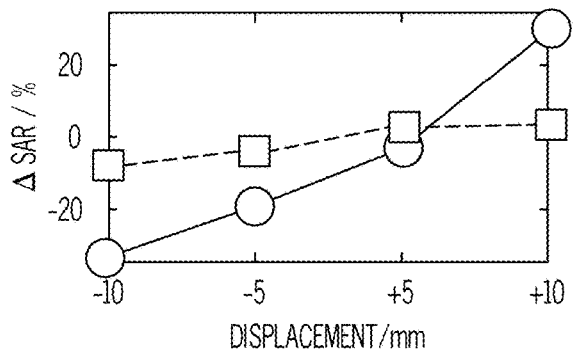
Figure 22E:
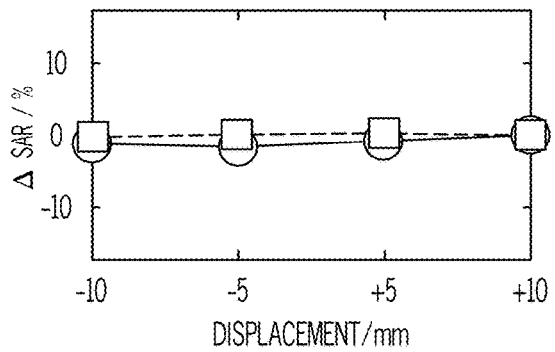
Figure 22F:
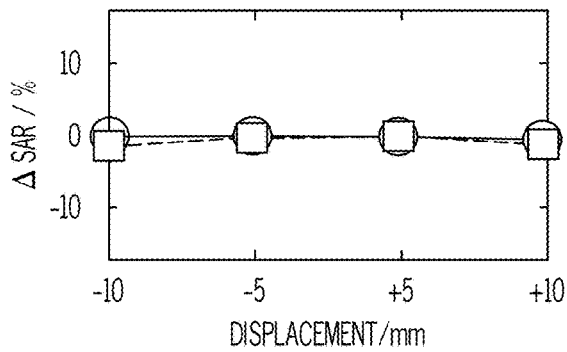
Figure 23A:
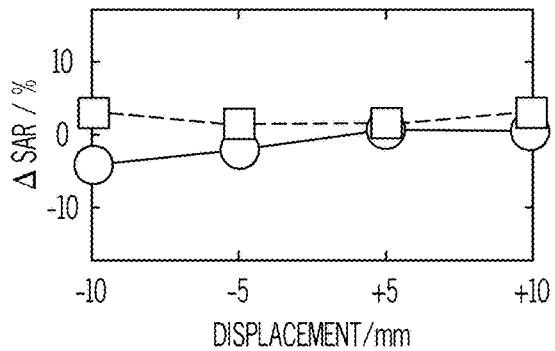
Figure 23B:
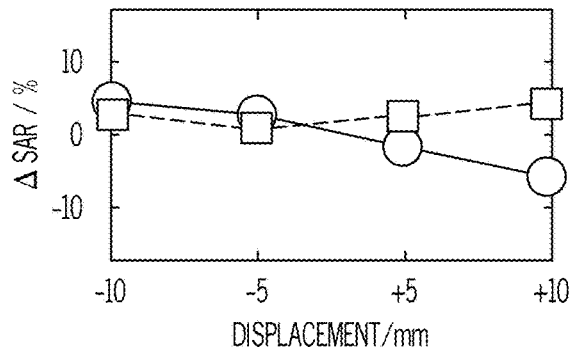
Figure 23C:
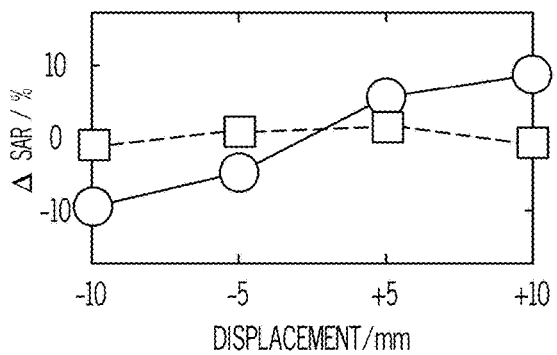
Figure 23D:
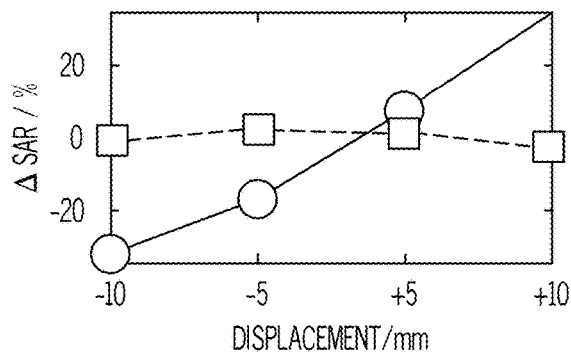
Figure 23E:
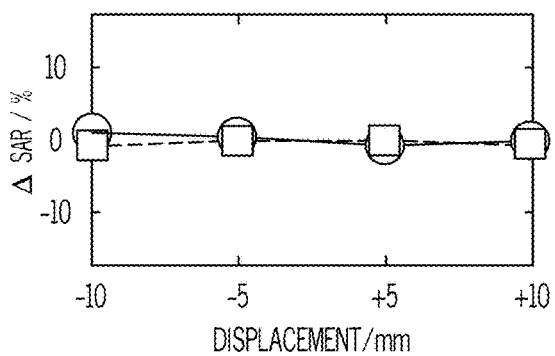
Figure 23F:
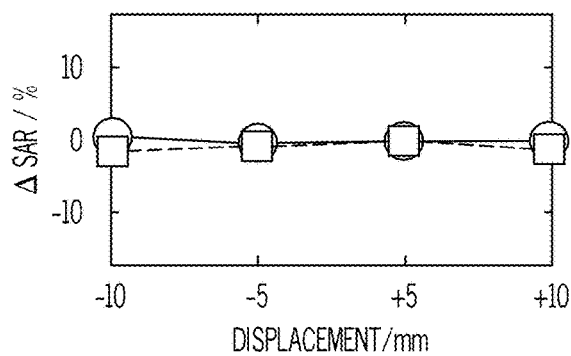

FIGS. 21A-21B illustrate comparison of 1 g averaged specific absorption rate (SAR) values in simulation for (FIG. 21A) screw family and plate system for the 1.5T MRI (64 MHz), (FIG. 21B) screw family and plate system for the 3T MRI (128 MHz), the solid line with the circles is for the ASTM standard test using typical birdcage coil, the solid line with square is for the E-field generator, and the dashed is for the ASTM standard test using the simplified generic coil.

FIGS. 22A-22F illustrate SAR sensitivity of the screw family with respect to positioning error along (FIG. 22A) (FIG. 22B) the x-direction at 64 MHZ and 128 MHz, (FIG. 22C) (FIG. 22D) y-direction at 64 MHz and 128 MHz, (FIG. 22E) (FIG. 22F) z-direction at 64 MHz and 128 MHz. The solid line indicates data in the ASTM phantom, while the dashed line indicates data for the E-field generator.

FIGS. 23A-23F illustrate SAR sensitivity of the plates system with respect to positioning error along (FIG. 23A) (FIG. 23B) the x-direction at 64 MHZ and 128 MHz, (FIG. 23C) (FIG. 23D) y-direction at 64 MHZ and 128 MHz, (FIG. 23E) (FIG. 23F) z-direction at 64 MHZ and 128 MHz. The solid line indicates data in the ASTM phantom, while the dashed line indicates data for the E-field generator.

Figure 24:
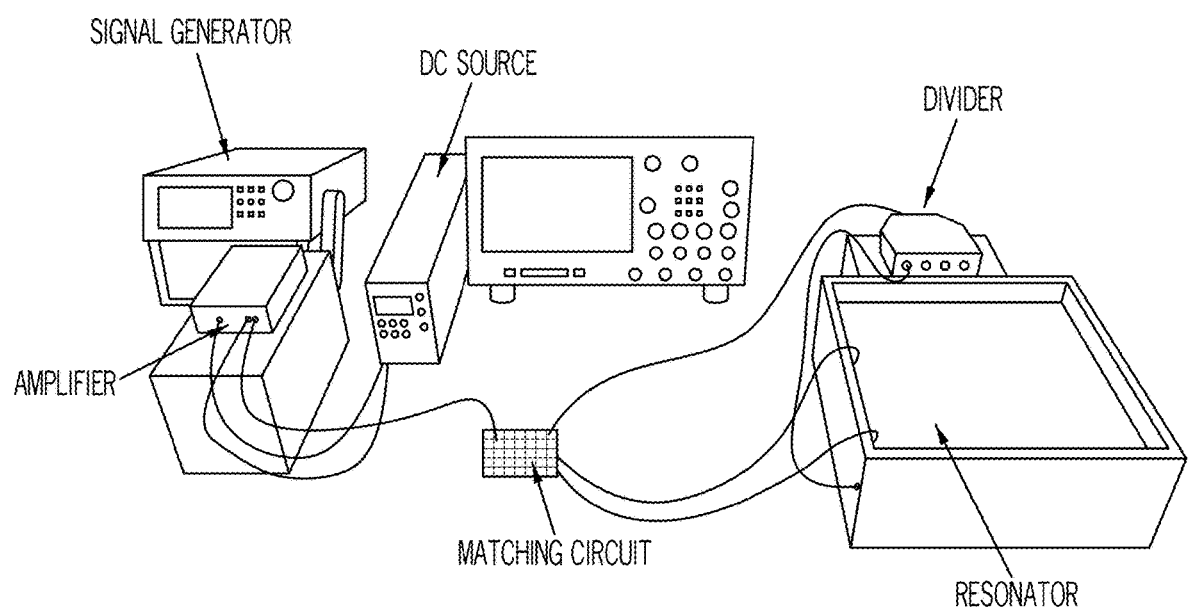

FIG. 24 illustrates an experimental setup for the E-field generator validation.

Figure 25A:
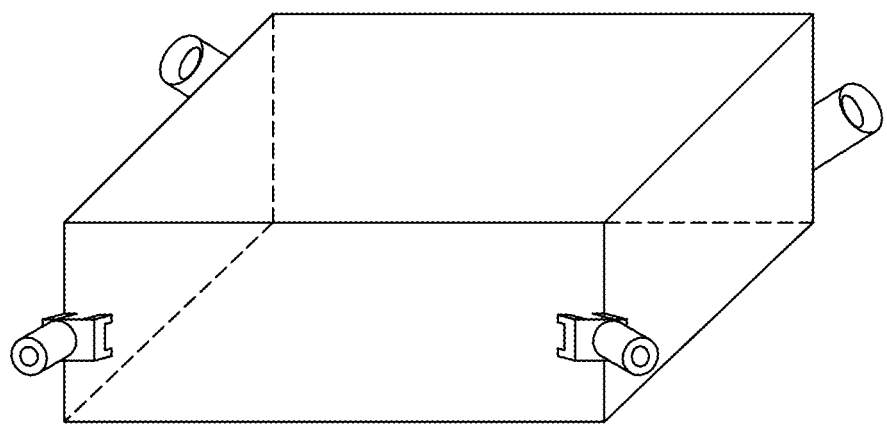
Figure 25B:
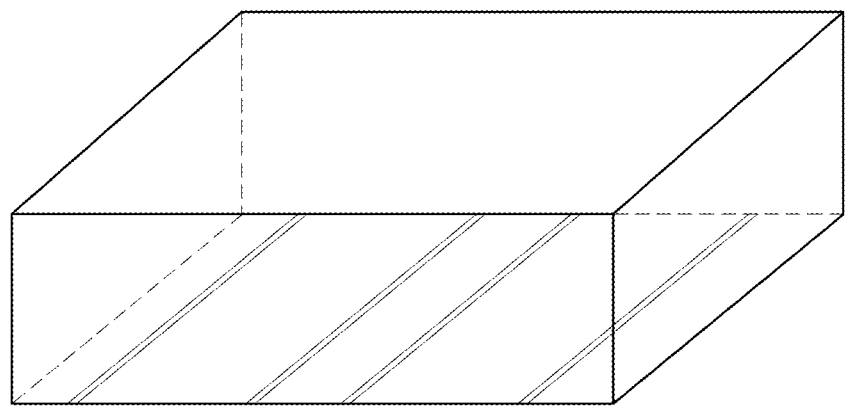

FIGS. 25A-B illustrate an illustrative design showing a feeding network at (FIG. 25A) four corners and (FIG. 25B) a feeding network with four strips.

Figure 26A:
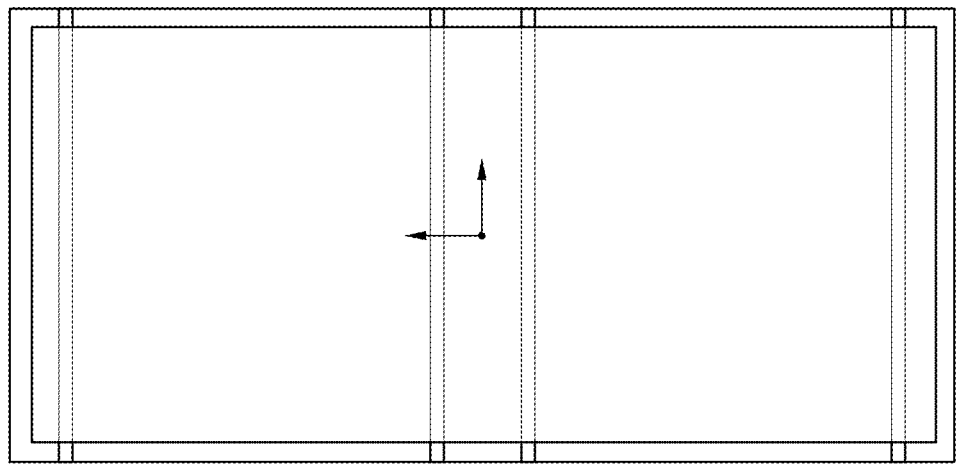
Figure 26B:
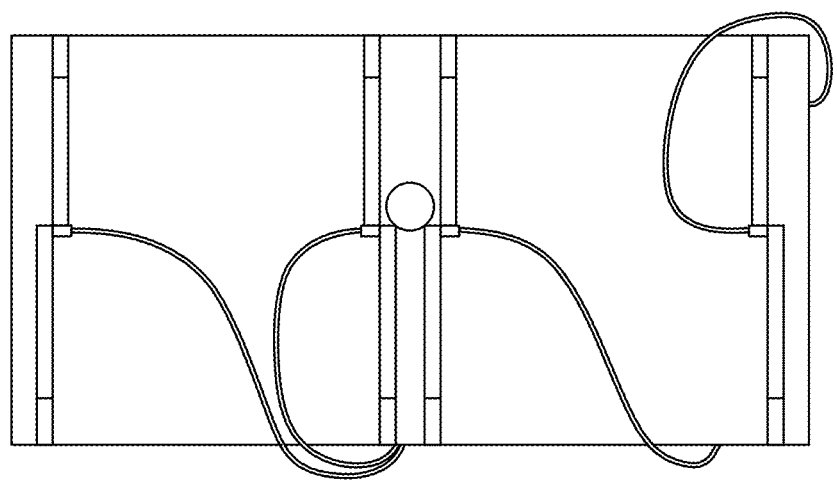

FIGS. 26A-B illustrates an (FIG. 26A) initial design and (FIG. 26B) prototype of an electric field generator according to aspects of an alternative design.

Figure 27A:
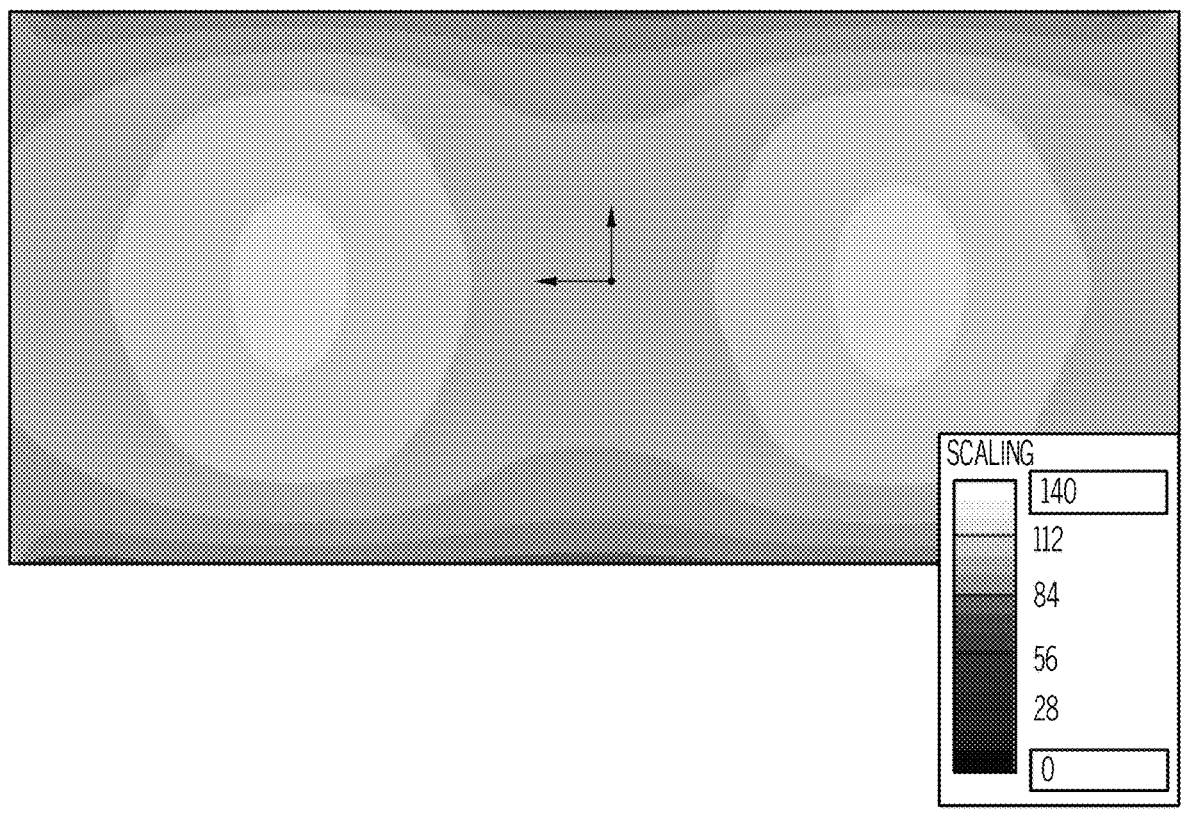
Figure 27B:
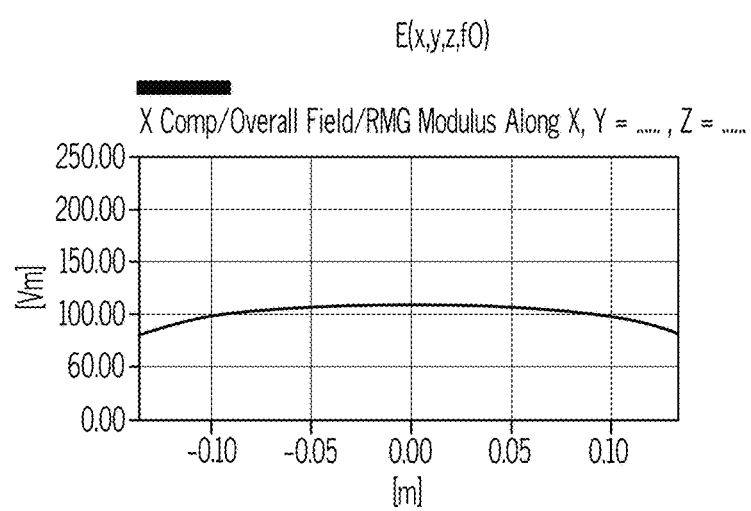

FIGS. 27A-27B illustrate that an electric field generated by an electric field generator utilizing four strips for the feeding network has good uniformity.

Figure 28A:
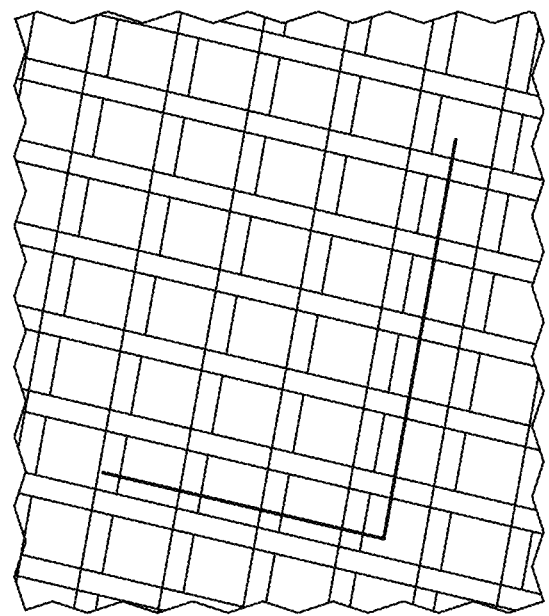
Figure 28B:
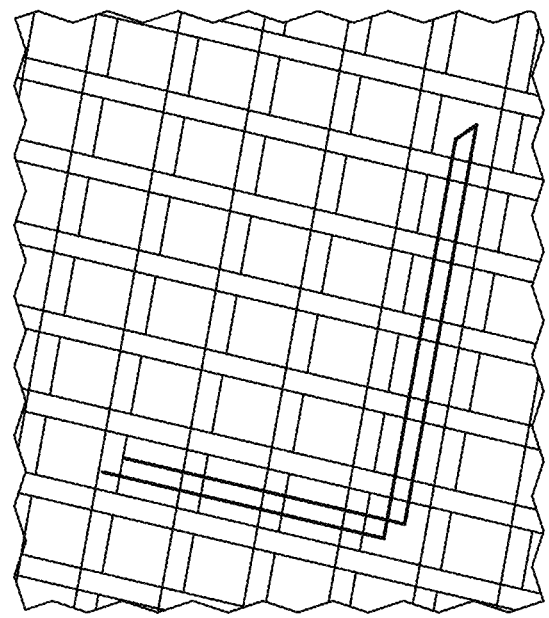

FIGS. 28A-B illustrate a design pathway on a (FIG. 28A) single layer and a (FIG. 28B) two-layered pathway design with three-dimensionally printed constructs.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that include more than one unit unless specifically stated otherwise.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Magnetic resonance imaging (MRI) is a widely used imaging method due to its non-invasive nature and high image quality. During the MRI procedure, radio frequency (RF) signals penetrate the human body and interact with the tissues. For patients with electrically conductive implantable medical devices (IMDs), the conductive parts will interact strongly with the electromagnetic fields and lead to localized RF energy deposition in tissues near the IMDs. There are numerous reports about patient burn incidents and influences on IMDs function caused by such highly concentrated power deposition. Currently, performing RF-induced heating tests based on the ASTM standard requires a large sized RF coil for each frequency to be studied and a high-power supply system together with a large shielded room. Such RF coils are available as part of MRI systems or equivalent test systems based on birdcage coils or transverse electromagnetic coils. Due to potential differences in coil types and coil sizes, local incident field calibration is required. Additionally, the linear variation of the electric field along the radial direction inside the phantom in a typical RF birdcage coil will limit the test region to achieve a high signal to noise ratio. The limited test region also requires accurate IMDs positioning systems to reduce experimental uncertainty.

Accordingly, a need exists for more effective systems and methods for testing medical device. Various embodiments of the present disclosure address the aforementioned need.

In some embodiments, the present disclosure pertains to electric field generators that include an enclosed shape with a cavity therein for housing a medical device (e.g., a rectangular shape) and a power divider. In some embodiments, the electric field generator also includes a base area at the bottom of the enclosed shape.

Figure 1A:
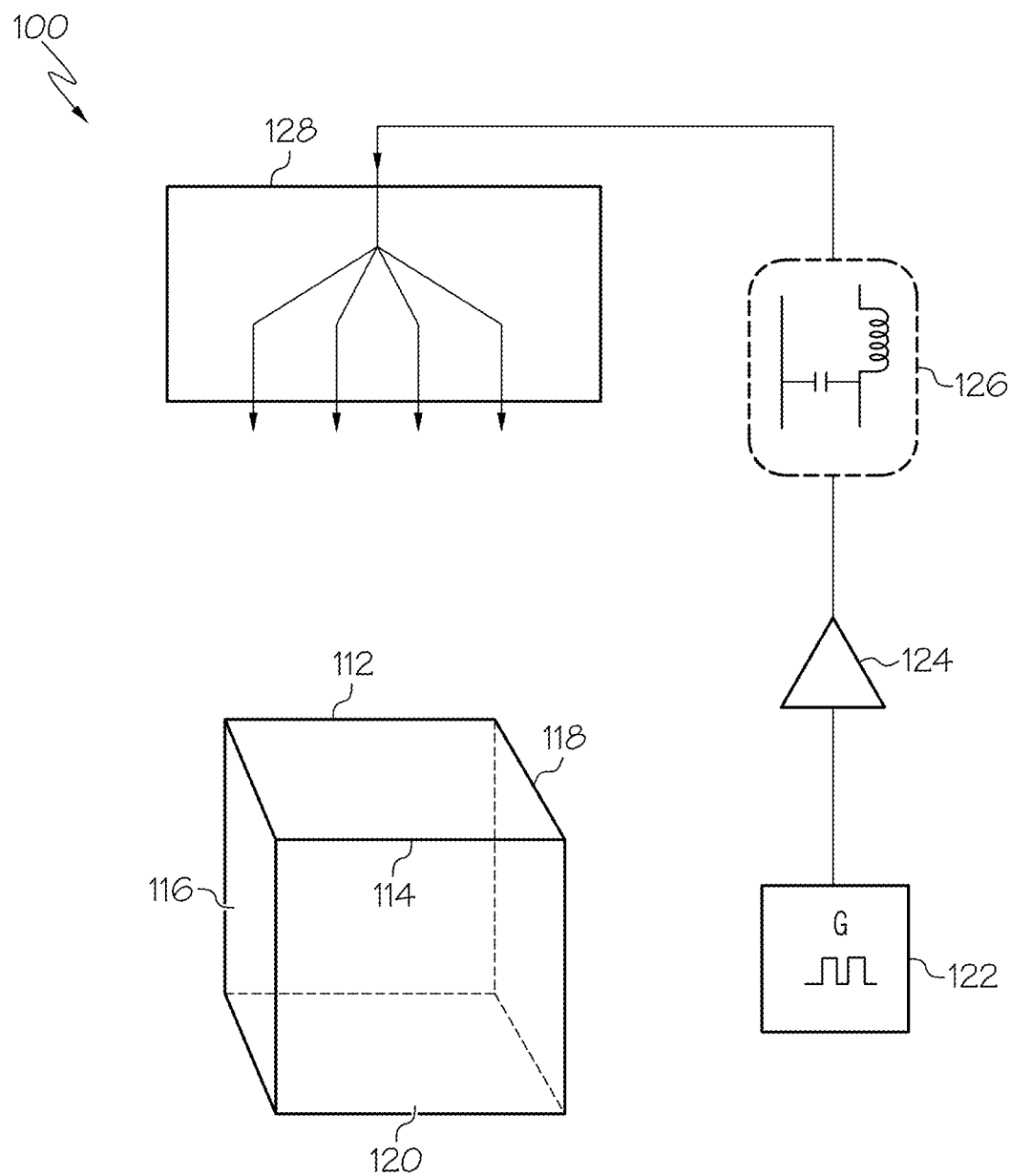
FIG. 1A illustrates an electric field generator for testing a medical device according to an aspect of the present disclosure.

In some embodiments illustrated in FIG. 1A, the electric field generator (100) includes a first wall (112), a second wall (114), a third wall (116), and a fourth wall (118) that form the enclosed shape. In some embodiments, the first wall (112) and the second wall (114) are on opposite sides of one another. In some embodiments, the third wall (116) and the fourth wall (118) are on opposite sides of one another. In some embodiments, the first wall (112) and the second wall (114) are spaced apart via the third wall (116) and the fourth wall (118). In some embodiments, the first wall (112) and the second wall (114) intersect with the third wall (116) and the fourth wall (118) to thereby form an enclosed shape having a cavity therein for housing a medical device. In some embodiments, electric field device (100) includes a base area (120) at the bottom of the enclosed shape.

As shown in FIG. 1A, the electric field generator (100) further includes a signal generator (122) electrically connected to a power amplifier (124), an impedance matching circuit (126) electrically connected to the power amplifier (124), and a power divider (128) electrically connected to the impedance matching circuit (126) and to at least one of the first wall (112), the second wall (114), the third wall (116), the fourth wall (118), or the base area (120).

The electrical connection in FIG. 1A from the power divider (128) to one or more of the first wall (112), the second wall (114), the third wall (116), the fourth wall (118), or the base area (120) is not shown. Reference to such electrical connections to the electric generator (100) are described in further detail below with respect to FIGS. 1B-1C.

Figure 1B:
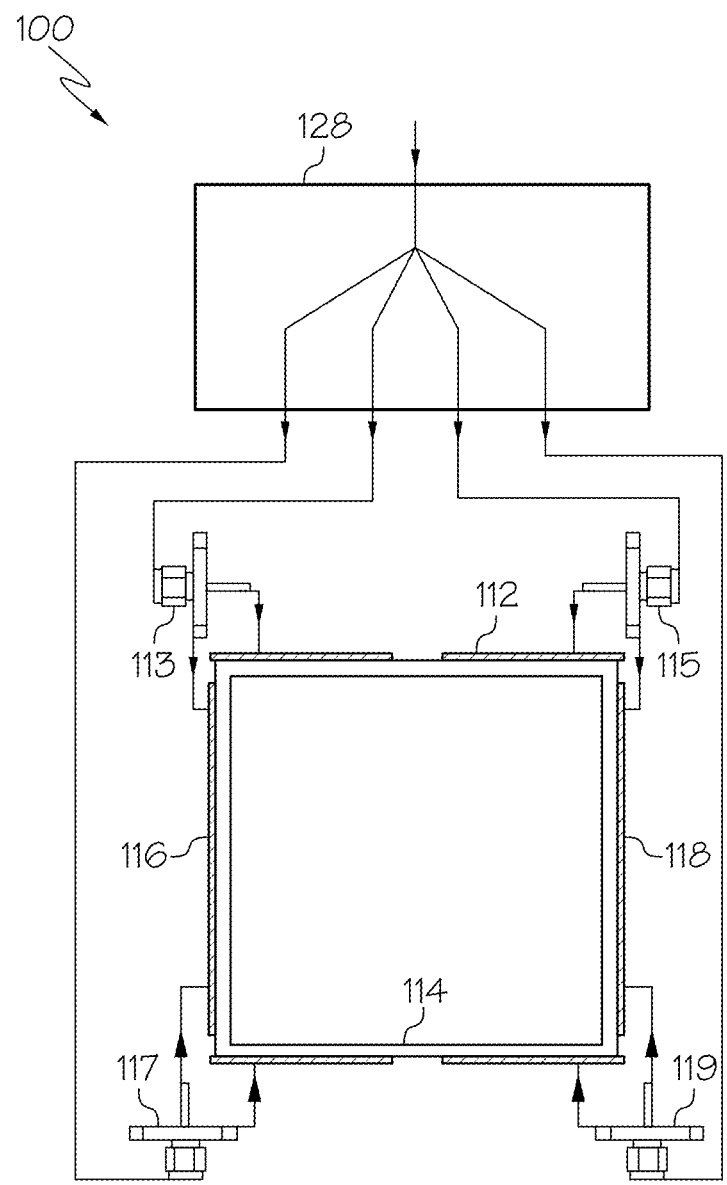
FIG. 1B illustrates a top down view of the electric field generator in FIG. 1A.

FIG. 1B illustrates a top-down view of the electrical generator (100) of FIG. 1A according to an embodiment of the present disclosure. As shown in FIG. 1B, the power divider (128) diverts power four ways. As depicted in FIG. 1B one output (113) is electrically connected to the first wall (112) and the third wall (116), one output (115) is electrically connected to the first wall (112) and the fourth wall (118), one output (117) is electrically connected to the third wall (116) and the second wall (114), and one output (119) is electrically connected to the second wall (114) and the fourth wall (118).

Figure 1C:
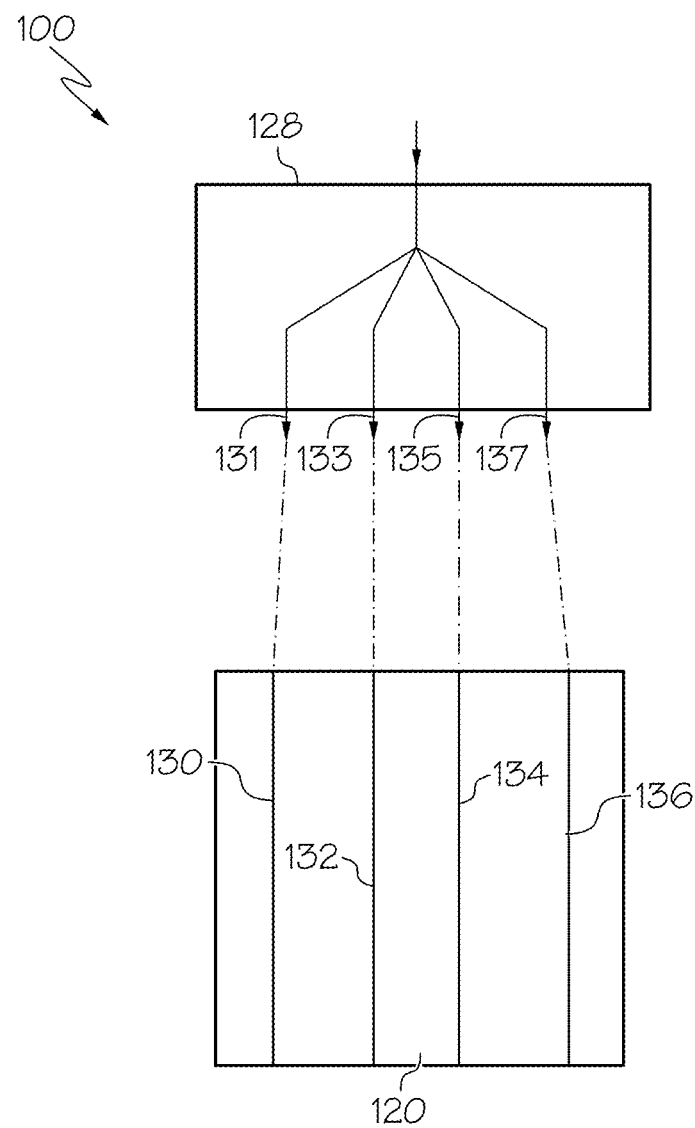
FIG. 1C illustrates a top down view of an alternative design for the electric field generator in FIG. 1A.

FIG. 1C illustrates a top-down view of the electrical generator (100) of FIG. 1A according to an alternative embodiment of the present disclosure. As shown in FIG. 1C, the base area (120) includes a first strip (130), a second strip (132), a third strip (134), and a fourth strip (136). In some embodiments illustrated in FIG. 1C, the power divider (128) diverts power four ways. As depicted in FIG. 1C, one output (131) is electrically connected to the first strip (130), one output (133) is electrically connected to the second strip (132), one output (135) is electrically connected to the third strip (134), and one output (137) is electrically connected to the fourth strip (136).

Figure 1D:
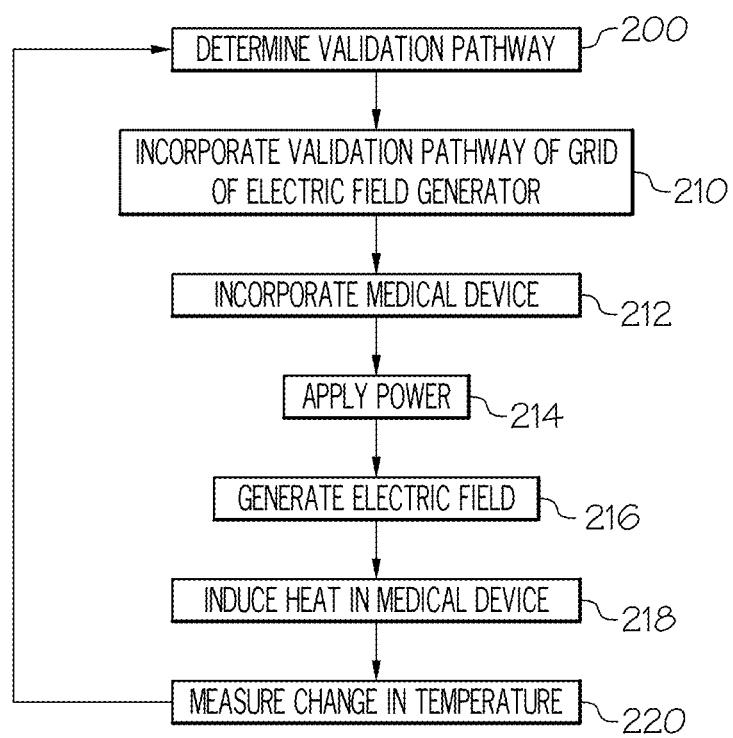
FIG. 1D illustrates a method of determining radio frequency (RF)-induced heating on a medical device (such as during phantom testing) according to an aspect of the present disclosure

Additional embodiments of the present disclosure pertain to methods of determining RF-induced heating on a medical device. In some embodiments illustrated in FIG. 1D, the methods of the present disclosure include one or more of the following steps of: determining a validation pathway (step 200), incorporating the validation pathway on a grid in an electric field generator (210), such as an electric field generator according to FIGS. 1A-1C, incorporating the medical device in a central slice of a conductive composition within the electric field generator (step 212), applying power to the electric field generator (step 214), such as an electric field generator according to FIGS. 1A-1C, generating a uniform electric field within the electric field generator (step 216), such that the uniform electric field induces RF-heating within the medical device (step 218), and measuring a change in temperature of the medical device (step 220). In some embodiments, the method can be repeated on numerous devices or the same device multiple times.

As set forth in more detail herein, the electric field generators and methods of the present disclosure can have numerous embodiments. For instance, the electric field generators of the present disclosure can include various configurations. Furthermore, various methods may be utilized to determine RF-induced heating on a medical device utilizing the electric field generators of the present disclosure. In addition, the electric field generators of the present disclosure can have various advantageous properties.

Electric Field Generator

In an embodiment, the present disclosure pertains to an electric field generator, that can be used for example, to test a medical device, such as an implantable medical device. In some embodiments, the electric field generator includes a first wall, a second wall, a third wall, and a fourth wall that form an enclosed shape with a cavity therein for housing a medical device. In some embodiments, the electric field generator also includes a base area at the bottom of the enclosed shape. In some embodiments, the electric field generator also includes a power divider electrically connected to at least one of the first wall, the second wall, the third wall, the fourth wall, or the base area.

In some embodiments, the first wall and the second wall are on opposite sides of one another. In some embodiments, the third wall and the fourth wall are on opposite sides of one another.

As used in this Application, walls on opposite sides of one another refer to coplanar walls that do not intersect with one another. In some embodiments, the walls are parallel to one another (i.e., equidistant from one another at every region within a plane). In some embodiments, the walls are not parallel to one another. For instance, in some embodiments, the walls may be canted relative to one another. In some embodiments, the walls may be canted inwards towards each other, or outwards away from each other.

In some embodiments, the first wall and the second wall are spaced apart via the third wall and the fourth wall. In some embodiments, the first wall and the second wall intersect with the third wall and the fourth wall to form the enclosed shape. In some embodiments, each of the first wall and the second wall can intersect with each of the third wall and the fourth wall at a certain angle. In some embodiments, the intersecting angle is a right angle of about 90 degrees. In some embodiments, the intersecting angle may be higher or lower than 90 degrees. For instance, in some embodiments, the intersecting angle may range from about 35 degrees to about 135 degrees. In some embodiments, the enclosed shape is in the form of a rectangular shape. In some embodiments, the enclosed shape is in the form of a square-like shape. In some embodiments, the enclosed shape is in the form of a trapezoidal shape. In some embodiments, the enclosed shape is in the form of an elliptical shape.

In some embodiments, a base area is at the bottom of the enclosed shape. In the some embodiments, the base area is defined by a hollow cavity. In some embodiments, the base area is defined by a wall. In some embodiments, the wall is a non-conductive wall, a plastic wall, or combinations thereof. In some embodiments, the wall has one or more openings, such as holes or apertures.

Medical devices may be housed in certain regions of the cavities of the enclosed shapes. For instance, in some embodiments, medical devices may be housed in a central region of the enclosed shape. In some embodiments, medical devices may be housed at the bottom of the enclosed shape near the base area. In some embodiments, medical devices may be housed at the bottom and center of the enclosed shape at the base area.

In some embodiments, the electric field generator further includes a power divider electrically connected to at least one of the first wall, the second wall, the third wall, the fourth wall, or the base area. In some embodiments, the power divider is electrically connected to at least two of the first wall, the second wall, the third wall, the fourth wall, or the base area. In some embodiments, the power divider is electrically connected to at least three of the first wall, the second wall, the third wall, the fourth wall, or the base area. In some embodiments, the power divider is electrically connected to at least four of the first wall, the second wall, the third wall, the fourth wall, or the base area.

In some embodiments, the power divider is electrically connected to the first wall, the second wall, the third wall, and the fourth wall. In some embodiments, the power divider is electrically connected to the first wall, the second wall, the third wall, the fourth wall, and the base area.

A power divider may be electrically connected to the first wall, the second wall, the third wall, the fourth wall, or the base area in various manners. For instance, in some embodiments, the electrical connection is a direct electrical connection between the power divider and at least the first wall, the second wall, the third wall, the fourth wall, or the base area. In some embodiments, the electrical connection is an indirect electrical connection between the power divider and at least the first wall, the second wall, the third wall, the fourth wall, or the base area.

In some embodiments, the power divider is electrically connected to a power source. In some embodiments, the power source includes an impedance matching circuit, a power amplifier, and a signal generator. In some embodiments, the power divider is electrically connected to an impedance matching circuit. In some embodiments, the impedance matching circuit is electrically connected to a power amplifier. In some embodiments, the power amplifier is electrically connected to signal generator. In some embodiments, the aforementioned electrical connections may be direct electrical connections. In some embodiments, the aforementioned electrical connections may be indirect electrical connections.

Configurations

As set forth in further detail herein, the electric field generators of the present disclosure can have numerous configurations. For example, in some embodiments, the power divider is a power divider having a first output, a second output, a third output, and a fourth output. In some embodiments, the first output is electrically connected to the first wall and the third wall. In some embodiments, the second output is electrically connected to the first wall and the fourth wall. In some embodiments, the third output is electrically connected to the third wall and the second wall. In some embodiments, the fourth output is electrically connected to the second wall and the fourth wall. In some embodiments, the power divider is a four-way power divider.

In some embodiments, the electric field generator further includes a first gap on the third wall at a location relative to an intersection of the first wall and the third wall, a second gap on the third wall at a location relative to an intersection of the second wall and the third wall, a third gap on the fourth wall at a location relative to an intersection of the first wall and the fourth wall, and fourth gap on the fourth wall at a location relative to an intersection of the second wall and the fourth wall.

In some embodiments, each of the first output, the second output, the third output, and the fourth output are electrically connected to one of the first gap, the second gap, the third gap, and the fourth gap to thereby form even and differential excitations between the first wall and the second wall.

In some embodiments, the electric field generator further includes a fifth gap on the first wall at a location relative to a center of the first wall and a sixth gap on the second wall at a location relative to a center of the second wall. In some embodiments, the fifth gap and the sixth gap decouple the third wall and the fourth wall.

In some embodiments, the even and differential excitations between the first wall and the second wall and the decoupled third wall and the decoupled fourth wall form a feeding network. In some embodiments, the feeding network ensures modes with electric field components along a direction aligned with (e.g., parallel to) the third wall and the fourth wall can be excited. In some embodiments, an electric field of the modes are symmetric with respect to an axis aligned with (e.g., parallel to) the first wall and the second wall and an axis aligned with (e.g., parallel to) the third wall and the fourth wall.

In some embodiments, the power divider is a power divider having a first output, a second output, a third output, and a fourth output. In some embodiments, the first output is electrically connected to a first strip. In some embodiments, the second output is electrically connected to a second strip. In some embodiments, the third output is electrically connected to a third strip. In some embodiments, the fourth output is electrically connected to a fourth strip.

In some embodiments, the first strip, the second strip, the third strip, and the fourth strip are distributed side-by-side across the base area (e.g., in parallel configuration) and spaced apart one from another, thereby forming a feeding network that generates a uniform electric field distribution in a depth direction of the electric field generator to thereby form a double layered configuration for lead pathways. In some embodiments, the uniform electric field distribution allows for validation pathways on a top region and a bottom region. In some embodiments, excitation current is located at a bottom portion of the electric field generator.

Conductive Compositions

As set forth in further detail herein, the electric field generators of the present disclosure can utilize various conductive compositions. In some embodiments, a central region of the electric field generator is filled with a conductive composition. In some embodiments, the cavity within the enclosed shape of the electric field generator is filled with a conductive composition.

In some embodiments, the conductive composition is in the form of a solution. In some embodiments, the conductive composition is in the form of a liquid. In some embodiments, the conductive composition is in the form of a solid. In some embodiments, the conductive composition is in the form of a gel.

In some embodiments, the conductive composition is a gel material. In some embodiments, the conductive composition is a gelled saline. In some embodiments, the conductive composition is a polymer-based conductive composition, such as a polyacrylic acid (PAA)-based conductive composition. In some embodiments, the conductive composition has a relative permittivity in a range of approximately 50 to 100. In some embodiments, the relative permittivity is approximately 87. In some embodiments, the conductive composition has an electrical conductivity in a range of approximately 0.01 to 2.9 S/m. In some embodiments, the conductive composition has an electrical conductivity in a range of approximately 0.25 to 0.75 S/m. In some embodiments, the electrical conductivity is approximately 0.47 S/m.

Resonance Frequencies and Excitations

As set forth in further detail below, the electric field generators of the present disclosure can produce various resonance frequencies and have various excitations. For example, in some embodiments, dimensions of at least one of the first wall, the second wall, the third wall, or the fourth wall are selected to produce a resonance frequency in the electric field generator of at least 64 MHz. In some embodiments, the resonance frequency is at least 128 MHz. In some embodiments, the resonance frequency is between 50 MHz and 200 MHz. In some embodiments, the resonance frequency is between 50 MHz and 150 MHz. In some embodiments, the resonance frequency is between 64 MHz and 128 MHz. In some embodiments, at least one of the first wall, the second wall, the third wall, or the fourth wall include a flexible circuit board with excitations.

Methods for Determining Radio Frequency (RF)-Induced Heating

In an embodiment, the present disclosure pertains to a method of determining RF-induced heating on a medical device. In some embodiments, the method includes one or more of the following steps of: (1) determining a validation pathway; (2) incorporating the validation pathway on a grid in an electric field generator; (3) incorporating the medical device in a central slice of a conductive composition within the electric field generator; (4) applying power to the electric field generator; (5) generating a uniform electric field within the electric field generator, such that the uniform electric field induces RF-heating within the medical device; and (6) measuring a change in temperature of in the conductive composition near the medical device. In some embodiments, the methods of the present disclosure may be utilized to develop and validate a medical device electromagnetic model for RF-induced heating.

Validation Pathways

As set forth in further detail herein, the methods of the present disclosure can utilize various validation pathways. For example, in some embodiments, the validation pathway is based, at least in part, on at least one of low correlations of electric fields along different pathways, generating high temperature rises for RF-induced heating, or mechanical design of the medical device.

Electric Fields

The methods of the present disclosure may generate various types of electric fields. For instance, in some embodiments, the electric field is a uniform electric field. In some embodiments, the magnetic field generated by an MR RF coil is used for the purpose of imaging. As such, in come embodiments, the electric field is the secondary effect induced by the RF coil. Since RF-induced heating for implantable devices is only related to the electric field, for the purpose of implantable device RF-induced heating assessment, one can develop a system in some embodiments that directly generate the electric field for a better efficiency. In some embodiments, one can also optimize the system to generate uniform electric fields to further minimize the measurement error.

Electric Field Generator Configuration

As set forth in further detail herein, the methods of the present disclosure can utilize electric field generators having various conditions. For example, in some embodiments, the electric field generator can include any of the electric field generators as described herein.

In some embodiments, the electric field generator includes a first wall, a second wall, a third wall, and a fourth wall that form an enclosed shape with a cavity therein for housing a medical device. In some embodiments, the electric field generator also includes a base area at the bottom of the enclosed shape. In some embodiments, the electric field generator also includes a power divider electrically connected to at least one of the first wall, the second wall, the third wall, the fourth wall, or the base area.

In some embodiments, the first wall and the second wall are on opposite sides of one another. In some embodiments, the third wall and the fourth wall are on opposite sides of one another. In some embodiments, the first wall and the second wall are spaced apart via the third wall and the fourth wall. In some embodiments, the first wall and the second wall intersect with the third wall and the fourth wall to form the enclosed shape. In some embodiments, a base area is at the bottom of the enclosed shape.

In some embodiments, the electric field generator further includes a power divider electrically connected to at least one of the first wall, the second wall, the third wall, the fourth wall, or the base area. In some embodiments, the power divider is electrically connected to a power source. In some embodiments, the power source includes an impedance matching circuit, a power amplifier, and a signal generator. In some embodiments, the power divider is electrically connected to an impedance matching circuit. In some embodiments, the impedance matching circuit is electrically connected to a power amplifier. In some embodiments, the power amplifier is electrically connected to signal generator.

In some embodiments, the power divider of the electric field generator is a power divider having a first output, a second output, a third output, and a fourth output. In some embodiments, the first output is electrically connected to the first wall and the third wall. In some embodiments, the second output is electrically connected to the first wall and the fourth wall. In some embodiments, the third output is electrically connected to the third wall and the second wall. In some embodiments, the fourth output is electrically connected to the second wall and the fourth wall. In some embodiments, the power divider is a four-way power divider.

In some embodiments, the electric field generator further includes a first gap on the third wall at a location relative to an intersection of the first wall and the third wall, a second gap on the third wall at a location relative to an intersection of the second wall and the third wall, a third gap on the fourth wall at a location relative to an intersection of the first wall and the fourth wall, and a fourth gap on the fourth wall at a location relative to an intersection of the second wall and the fourth wall.

In some embodiments, each of the first output, the second output, the third output, and the fourth output are electrically connected to one of the first gap, the second gap, the third gap, and the fourth gap to thereby form even and differential excitations between the first wall and the second wall.

In some embodiments, the electric field generator further includes a fifth gap on the first wall at a location relative to a center of the first wall and a sixth gap on the second wall at a location relative to a center of the second wall. In some embodiments, the fifth gap and the sixth gap decouple the third wall and the fourth wall.

In some embodiments, the even and differential excitations between the first wall and the second wall and the decoupled third wall and the decoupled fourth wall form a feeding network. In some embodiments, the feeding network ensures modes with electric field components along a direction aligned with (e.g., parallel to) the third wall and the fourth wall can be excited. In some embodiments, an electric field of the modes are symmetric with respect to an axis aligned with (e.g., parallel to) the first wall and the second wall and an axis aligned with (e.g., parallel to) the third wall and the fourth wall.

In some embodiments, the power divider of the electric field generator is a power divider having a first output, a second output, a third output, and a fourth output. In some embodiments, the first output is electrically connected to a first strip. In some embodiments, the second output is electrically connected to a second strip. In some embodiments, the third output is electrically connected to a third strip. In some embodiments, the fourth output is electrically connected to a fourth strip.

In some embodiments, the first strip, the second strip, the third strip, and the fourth strip are distributed side-by-side across the base area (e.g., in parallel configuration) and spaced apart one from another thereby forming a feeding network that generates a uniform electric field distribution in a depth direction of the electric field generator to thereby form a double layered configuration for lead pathways. In some embodiments, the uniform electric field distribution can form validation pathways on a top region and a bottom region.

In some embodiments, the electric field generators of the present disclosure act as rectangular waveguides to generate uniform electric fields. In some embodiments, uniform electric fields are generated when electromagnetic waves are transmitted longitudinally through the enclosed shape and reflected from the walls.

Methods of Making Electric Field Generators

Additional embodiments of the present disclosure pertain to methods of making electric field generators for testing a medical device, such as an implantable medical device. In some embodiments, the methods of the present disclosure include: assembling a first wall, a second wall, a third wall, and a fourth wall to form an enclosed shape having a cavity therein for housing a medical device; and assembling a base area at the bottom of the enclosed shape. In some embodiments, the assembling includes assembling a first wall and a second wall on opposite sides of one another; and assembling a third wall and a fourth wall on opposite sides of one another. As a result, the first wall and the second wall become spaced apart via the third wall and the fourth wall, and the first wall and the second wall intersect with the third wall and the fourth to form the enclosed shape.

In some embodiments, the methods of the present disclosure also include a step of electrically connecting a power divider to at least one of the first wall, the second wall, the third wall, the fourth wall, or the base area. In some embodiments, the methods of the present disclosure also include one or more steps of electrically connecting the power divider to an impedance matching circuit, electrically connecting the impedance matching circuit to a power amplifier, and electrically connecting the power amplifier to a signal generator.

In some embodiments, the power divider is a power divider that includes a first output, a second output, a third output, and a fourth output. In some of such embodiments, the methods of the present disclosure may also include one or more steps of: electrically connecting the first output to the first wall and the third wall; electrically connecting the second output to the first wall and the fourth wall; electrically connecting the third output to the third wall and the second wall; and electrically connecting the fourth output to the second wall and the fourth wall.

In some embodiments, a first gap is formed on the third wall at a location relative to an intersection of the first wall and the third wall, a second gap is formed on the third wall at a location relative to an intersection of the second wall and the third wall, a third gap is formed on the fourth wall at a location relative to an intersection of the first wall and the fourth wall, and a fourth gap is formed on the fourth wall at a location relative to an intersection of the second wall and the fourth wall. In such embodiments, the methods of the present disclosure may also include a step of electrically connecting each of the first output, the second output, the third output, and the fourth output to one of the first gap, the second gap, the third gap, and the fourth gap to thereby form even and differential excitations between the first wall and the second wall.

In alternative embodiments where the power divider is a power divider that includes a first output, a second output, a third output, and a fourth output, the methods of the present disclosure include one or more steps of: electrically connecting the first output to a first strip; electrically connecting the second output to a second strip; electrically connecting the third output to a third strip; and electrically connecting the fourth output to a fourth strip. In some embodiments, the methods of the present disclosure also include one or more steps of distributing the first strip, the second strip, the third strip, and the fourth strip across the base area in parallel configuration and spacing apart one from another to form a feeding network that generates a uniform electric field distribution in a depth direction of the electric field generator to thereby form a double layered configuration for lead pathways. In some embodiments, the uniform electric field distribution allows for validation pathways on a top region and a bottom region.

Applications and Advantages

The present disclosure can have various advantages. For instance, in some embodiments, the electric field generators of the present disclosure have at least the following valuable features: (1) the electric field generators of the present disclosure are more compact due to the integration of the 1.5 T (64 MHz) and 3 T (128 MHz) heating safety assessments; (2) the electric field generators of the present disclosure achieve lower uncertainty caused by the shift of pathways compared to a RF coil resulting from the higher electric field homogeneity; and (3) the orthogonality of the electric field along different pathways is significantly improved by a set of designed pathways as disclosed herein.

Additionally, highly correlated results for both frequencies 64 MHz and 128 MHz can be achieved with the electric field generators of the present disclosure. Moreover, the measured RF-induced heating is less sensitive to device positioning errors. Compared to the conventional methods using an RF coil and a phantom for testing, the electric field generators of the present disclosure have a significant advantage in terms of low cost, low operation power, ease of operation, and most importantly, integration of 1.5T and 3T RF heating tests into a single desk-top system. This provides a better alternative to evaluate the RF-induced heating of IMDs under MRI exposure.

As such, the electric field generators of the present disclosure can be utilized in various manners and for various purposes. For instance, in some embodiments, the electric field generators of the present disclosure can be utilized to determine RF-induced heating on medical devices, such as, for example, an IMD.

Additional Embodiments

Reference will now be made to more specific embodiments of the present disclosure and experimental results that provide support for such embodiments. However, Applicant notes that the disclosure below is for illustrative purposes only and is not intended to limit the scope of the claimed subject matter in any way.

Example 1. A Novel Device Model Validation Strategy for 1.5 T and 3 T Magnetic Resonance Imaging (MRI) Heating Safety Assessment This Example presents a novel test instrument and strategy for active implantable medical device (AIMD) model validation under a radio-frequency (RF) field generated by a magnetic resonance imaging (MRI) system. A high electric field generator is developed as an alternative instrument for standard MRI RF coils. This system is both compact and power efficient. In addition, a set of validation pathways are proposed based on the Hadamard matrix. These pathways provide low correlations among incident electric fields and yet generate relative high temperature rises. Two generic AIMDs with different lengths are used to validate the strategy experimentally. It is demonstrated that this method provides an efficient and effective alternative for future AIMDs model validation under MRI RF emissions.

Example 1.1. Introduction

Magnetic resonance imaging (MRI) examination is a common procedure used in hospitals today. For patients implanted with an active implantable medical device (AIMD), such as a neuro-stimulator or a deep brain stimulator, there is an increased demand to undergo MRI scanning. Since these devices often have long and insulated electrodes (lead body), they can act as a receiving antenna to collect the radiofrequency (RF) induced energy generated by the MRI RF coil and deposit the collected energy into the human tissue at the tip electrodes. Consequently, these localized energy depositions can lead to temperature rises near the tip electrode and may cause tissue damage.

To understand the mechanism of RF-induced heating, both numerical simulations and rigorously designed experiments were performed in recent years. Since it is challenging to perform comprehensive modeling of an AIMD with sub-millimeter features in large heterogeneous media, a transfer function concept was proposed to model the performance of AIMD exposed to RF fields. The transfer function for the lead model, referred to as the AIMD electrode model, relates the incident field on the device to the induced heating at the tip electrodes. Combined with the incident electric field, the transfer function can be utilized to predict the in-vivo RF-induced heating for AIMD along all possible implanted pathways inside the human body during the MRI procedure.

However, due to the numerical approximations and imperfections of the electromagnetic model of AIMD, the experimental validation of the theoretical result is necessary. The ISO/TS 10974 standard requires this transfer function model to be validated extensively before one can apply this for a clinically relevant study. In the validation, the directly measured temperature rises and predicted temperature rises using the transfer function model along these pathways should be compared against each other. If the differences between the predicted temperature rises and directly measured results are less than the test uncertainty, the transfer function model is considered to be validated. This procedure of comparing the measured results with those predicted by the transfer function method is referred to as the transfer function model validation test.

Designing the lead trajectories is critical for the model validation test in terms of effectiveness and robustness. Effectiveness is mainly determined by the orthogonality of the tangential electric field along the trajectories; while the robustness is related to the ability to produce relative high temperature rises so that the measured signal-to-noise ratio can be large. The ISO/TS 10974 standard presents some suggested lead trajectories including changes in magnitude, phase, or combinations of magnitude and phase in Annex M. However, electric fields along those trajectories are highly correlated, which could lead to two different transfer function models yielding similar temperature rises since the number of degrees of freedom existing in the incident electric field is insufficient. Also, it is very complicated to practically achieve, and also inconvenient as well since rectangular, elliptical, and circular phantoms are needed. For 1.5 T and 3 T systems, different RF coils are required which will increase the difficulty of the test efforts significantly.

In this Example, a novel validation test strategy employing highly orthogonal electrical field distributions along pathways in a designed electric field generating system is proposed. The inspiration for the pathway is from the Hadamard matrix, which already has a broad application in telecommunications and statistics. The electric field generating system is a rectangular resonator operating at either 64 MHz or 128 MHz, which are the resonant frequencies for 1.5 T and 3 T MRI systems, respectively. It can present a stable and homogeneous electric field with linear polarization over a large volume, and therefore provide an ideal environment to implement a high orthogonal electric field distribution along different pathways, as well as lowering the uncertainty due to the pathway shift. The entire system to perform the transfer function validation test for AIMDs is much smaller than the MRI RF coil. More significantly, it is capable of performing the validation tests for both 1.5 T and 3 T systems. It should be pointed out that this Example focuses on the model validation using temperature rises at AIMD tip electrode. It is assumed here that the power deposition near the tip electrode would be directly related to the temperature rises near the electrode tip.

Herein, the design and implementation of a multi-frequency electric field generator, along with the pathway development methodology, are illustrated. Two AIMDs with different lengths are used as examples to show their validity and feasibility. Then the proposed strategy is compared with that of ISO 10974 to demonstrate the advantage of orthogonality of the electric field distribution along different pathways and accuracy due to the field homogeneity. Finally, conclusions are discussed.

Example 1.2. Method

The transfer function is a numerical model to predict the RF-induced heating for AIMDs that are implanted in human tissue. It can be measured by a vector network analyzer (VNA) together with a current probe when assigning a radiating dipole at the lead tip. With the incident electric field tangential to the lead implantation trajectories when the lead is absent, the transfer function can accurately predict the temperature rises under specific RF field exposure, using $$\Delta T = |\int_L TF(l) E_{tan}(l) dl|^2, \quad \text{(Equation 1)}$$

where TF(l) is the transfer function of the AIMD with units of m·√°C./V, and $E_{tan}$ is the incident electric field tangential to the lead pathway with units of V/m. ΔT is the temperature rise with units of ° C. To ensure the AIMD model is accurate, TF(l) shall be validated along the predesigned incident electric field pathways per the ISO 10974 standard. The electric field distributions should be similar to those in real MRI scanning environments, to ensure the measurable temperature rises. Besides, as requested by ISO/TS 10974 8.8, "The selected incident fields for the validation shall be sufficiently different than the incident field(s) used for generating the AIMD model, and the difference shall be justified." Also, "The tangential electric field exposure set for validation shall include changes in magnitude, phase or combinations of magnitude and phase, at different locations spanning the length of the AIMD." Therefore, the electric fields along these pathways should be independent to others to satisfy the effectiveness of the validation test.

Figure 2A:
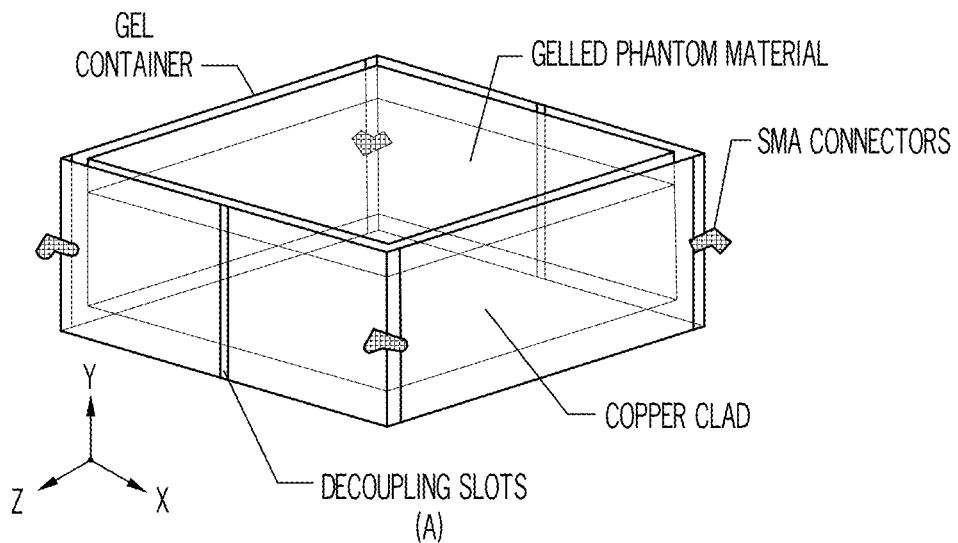
FIGS. 2A-2B illustrate a high electric field generating system.
Figure 2B:
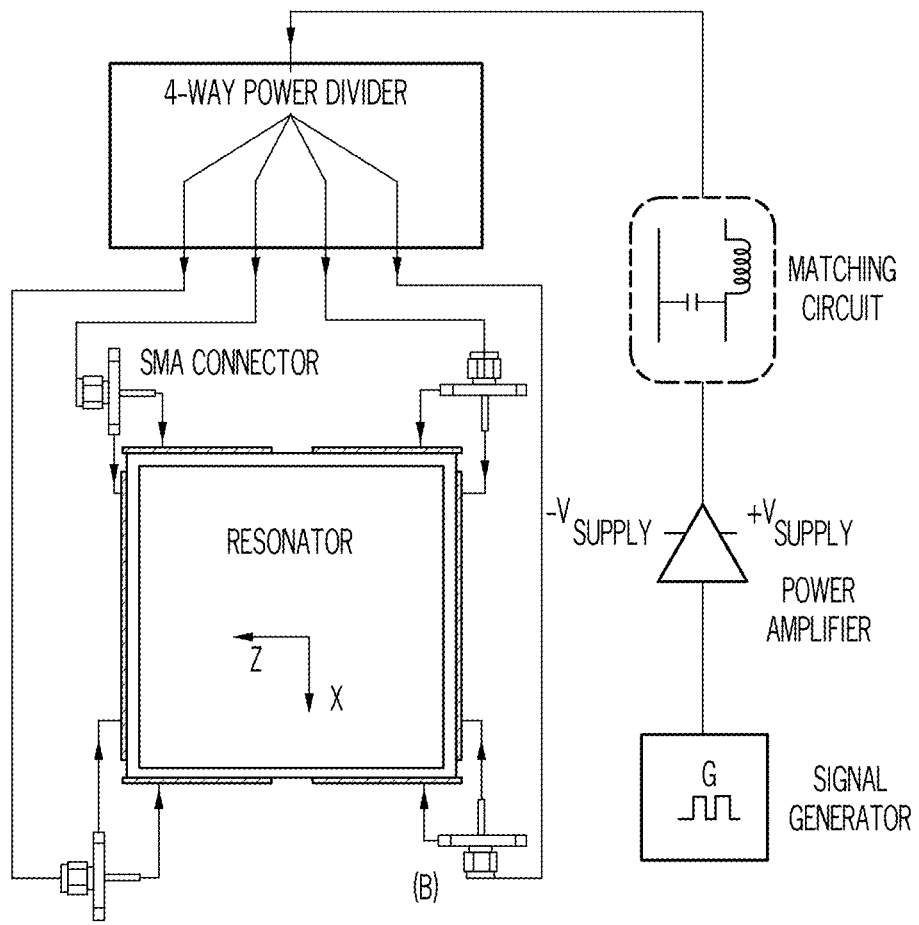

Multi frequency electric field generator design. A high electric field generator that resonates at both 64 MHz and 128 MHz is proposed to substitute for the MRI RF coil to perform the validation test. As shown in FIGS. 2A and 2B, the signal generator, the power amplifier, the four-way Wilkinson power divider with pre-matching circuits, and the resonator constitute the high electric field generating system.

Figure 3A:
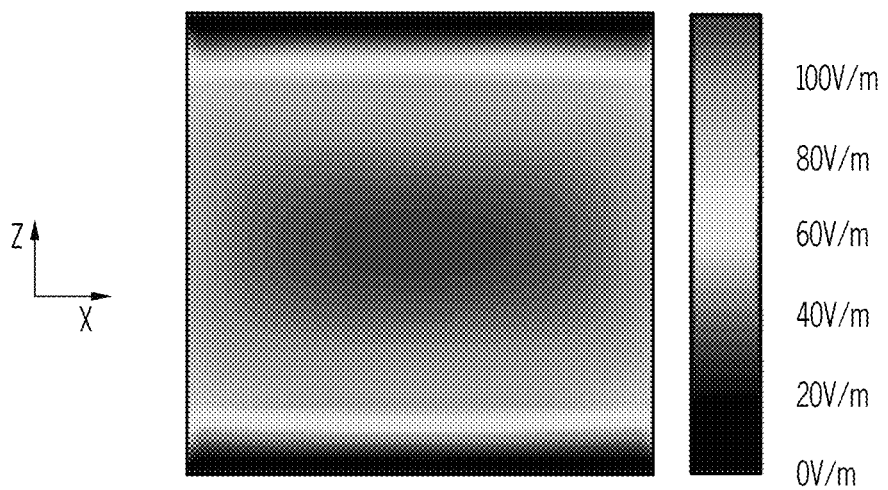
FIGS. 3A-3B illustrate simulated electric field distribution on the center slice of the gel (FIG. 3A) at 64 MHz and (FIG. 3B) at 128 MHz with an input power of 32.52 W and 13.77 W, respectively.
Figure 3B:
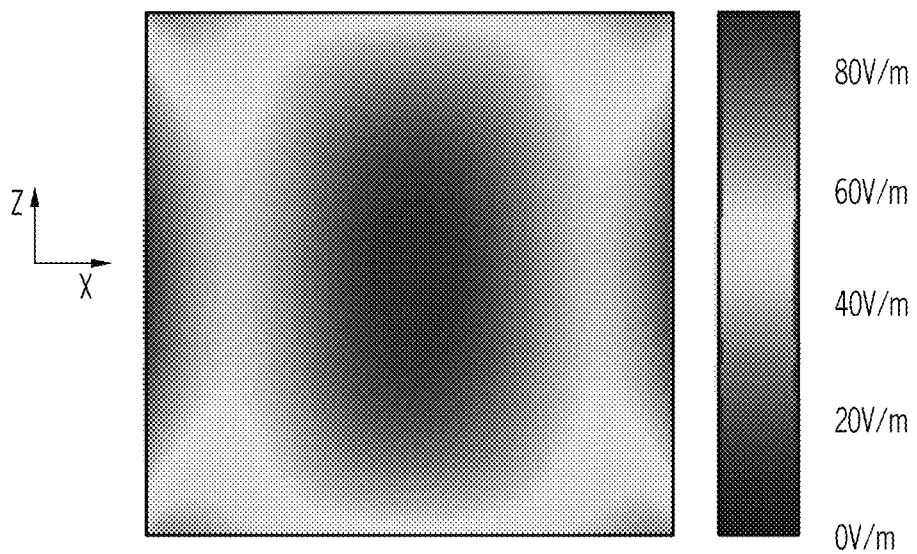

The sine or square wave coming from the signal generator is amplified by a power amplifier with gain of 50 dB. The matching circuit consisting of lumped elements adjusts the impedance seen by the input of the power divider to 50Ω. It has two separate sets of circuitries for each frequency. The high-power signal is divided into four ways with identical phase and magnitude. The special four-way feeding network is achieved by exciting the front (+z) and back (−z) walls respectively of the cavity as shown in FIGS. 2A-2B. The resonator has dimensions of 30 cm by 30 cm. The height of the gel, with relative permittivity of 78 and conductivity of 0.47 S/m, is 9 cm. With the boundary condition of a PEC on the surrounding four planes (±x and ±z) and a PMC on the gel-air interface (±y), the resonator supports the TE10 mode at 64 MHz, as well as the TE10 and TE12 modes at 128 MHz. The simulated electric field distribution at both frequencies is depicted in FIGS. 3A-3B.

The electric field distribution has been validated both by numerical simulation and experiment using a 10 cm titanium rod. The linear polarized electric field oriented in the z-direction provides an ideal environment to implement the highly orthogonal electric field distribution along different pathways.

Pathway design procedure in the field generator. The pathways used to perform the model validation test should meet the following criteria: (1) low correlations of electric fields along different pathways, which could be reflected by the low condition number of the complex matrix consisting of electric field along the validation pathway set; (2) generating high temperature rises for RF-induced heating so that better signal-to-noise ratio can be achieved in the measurement; and (3) mechanically achievable for AIMD.

Figure 4:
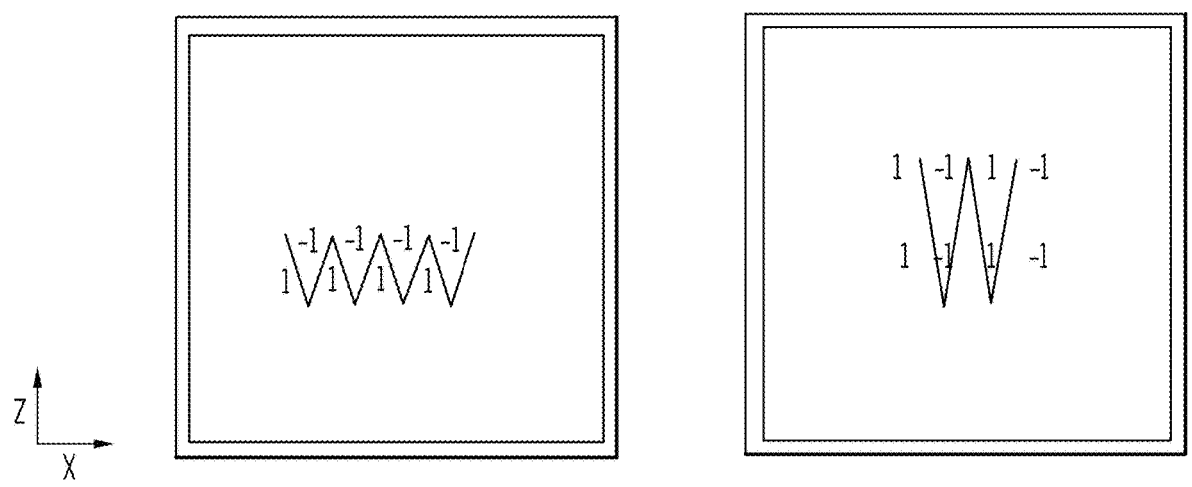
FIG. 4 illustrates the first two of seven pathways based on Hadamard matrix.

The rows of the Hadamard matrix, whose entries are either +1 or −1, are mutually orthogonal. It has been widely employed in telecommunication and statistics. An example of an eighth-order Hadamard matrix is shown below:

$$\begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

which is an 8 by 8 matrix with a condition number of 1. If one can find pathways along which the electric field can be mapped onto this matrix, the incident fields would then be orthogonal to each other. One way to realize pathways 2 and 3 in the matrix is shown in FIG. 4. By folding these pathways along the incident field direction, +1 and −1 in the matrix can be achieved.

However, these pathways fail to meet criterion (3), since bending the electrode along the pathway is very difficult in practice. To have relative smooth pathways with a still low correlated electric field, the following pathway matrix to use is proposed as:

$$\begin{bmatrix} 1 & 1 & 1 & 1 & 1 & 1 & 1 & 1 \\ 1 & 0 & 1 & 0 & 1 & 0 & 1 & 0 \\ 1 & 1 & 0 & 0 & 1 & 1 & 0 & 0 \\ 1 & 0 & 0 & 1 & 1 & 0 & 0 & 1 \\ 1 & 1 & 1 & 1 & 0 & 0 & 0 & 0 \\ 1 & 0 & 1 & 0 & 0 & 1 & 0 & 1 \\ 1 & 1 & 0 & 0 & 0 & 0 & 1 & 1 \\ 1 & 0 & 0 & 1 & 0 & 1 & 1 & 0 \end{bmatrix}.$$

Since the electric fields for both 1.5 T and 3 T are linearly polarized in the z-direction, 0 is equivalent to have the lead segment placed along the x-direction for the null electric field. The condition number of the revised matrix increases to 5.83, but the newly designed pathways can be easily achievable as shown in FIG. 5. The pathways corresponding to the first row were ignored since they are longer than the entire length of the test fixture.

For those AIMDs with different lengths, each segment length should be the total length divided by eight. Therefore, the revised Hadamard matrix can be treated as the design prototype of the validation pathway for the transfer function of the AIMDs.

Example 1.3. Results

Two AIMDs validation tests. To verify the feasibility of the proposed strategy, two generic AIMDs are used as examples. Both have a solid metal inner conductor with a radius of 0.4 mm. The inner conductors are coated by an outer silicon layer with a thickness of 0.4 mm. The relative permittivity of the silicon is 3.5. The lead lengths for the two AIMDs are 40 cm and 30 cm, respectively. Both AIMDs have a 5 mm bare lead tip at the distal end, and a dummy implantable pulse generator (IPG) made with a copper sheet connected to a 2Ω resistor at the proximal end. Based on the reciprocity theorem, the measured transfer functions are shown in FIGS. 6A-6D.

Figure 7A:
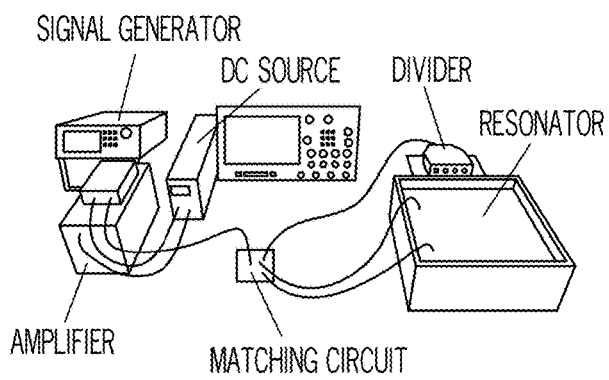
FIG. 7A illustrates a whole electric field generator system.
Figure 7B:
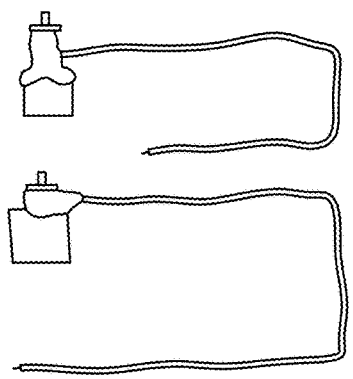
FIG. 7B illustrates two generic AIMDs with different lengths.
Figure 7C:
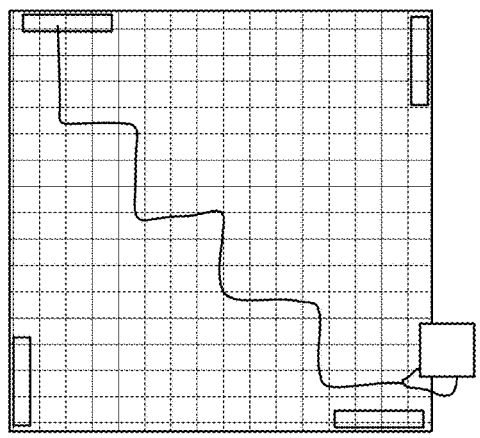
FIG. 7C illustrates the configuration of the first validation pathway for the 40 cm AIMD.
Figure 7D:
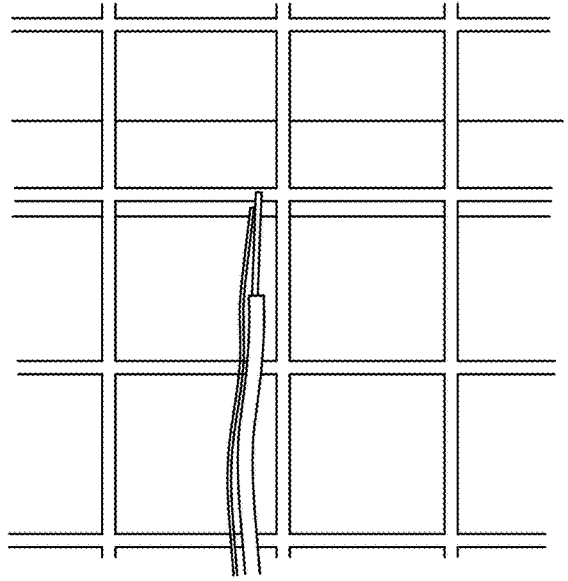
FIG. 7D illustrates the bare lead tip and thermal optical probe in proximity.
Figures 8A, 8B:
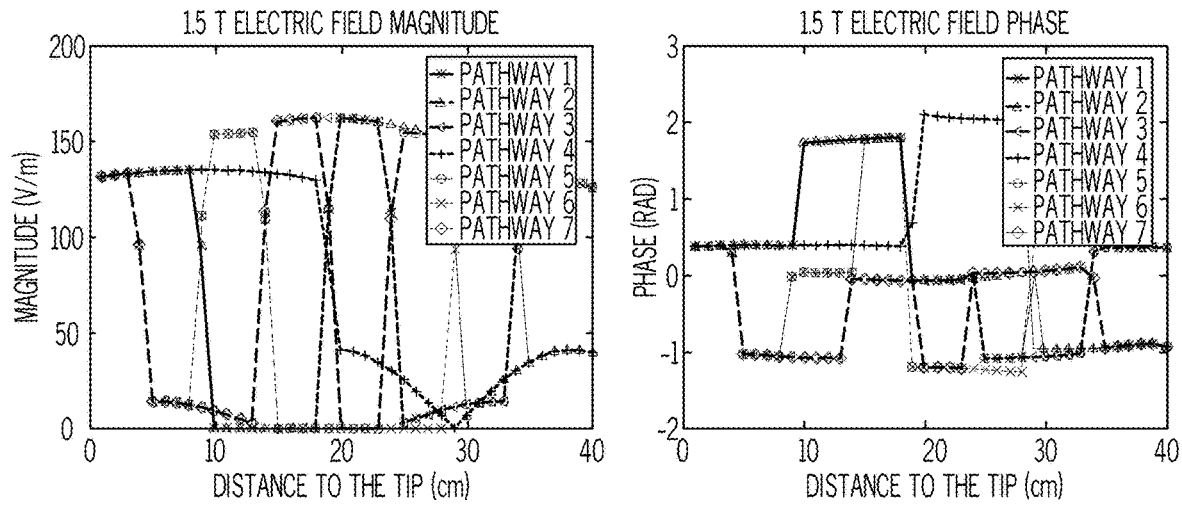
FIGS. 8A-8D illustrate simulated electric field distributions along seven pathways shown in FIG. 5.
Figures 8C, 8D:
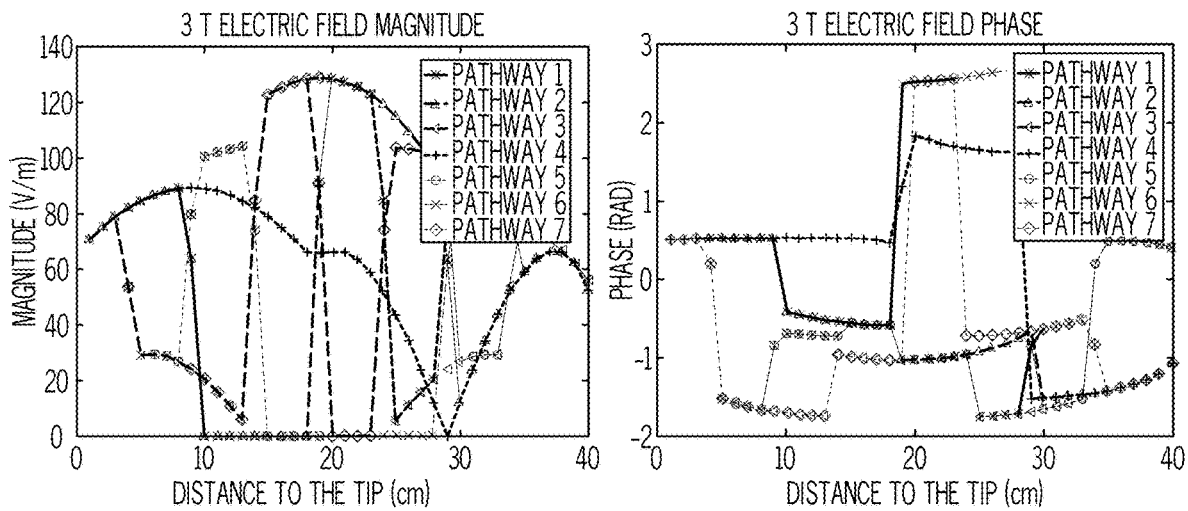

The field generating system is shown in FIG. 7A. The resonator is loaded by a 9 cm height polyacrylic acid (PAA) gel with dielectric parameters of 0.47 S/m and 78, for conductivity and relative permittivity, respectively. Two AIMDs shown in FIG. 7B are placed at the central slice of the gel. The first validation pathway for the 40 cm AIMD is shown in FIG. 7C. A plastic mesh is used to provide a stable fixation for the AIMDs. The temperature rise at the lead tip is recorded by the thermal optical probe, which is closely bonded onto the bare tip as shown in FIG. 7D. The duration of each exposure test with the RF source on was 5 minutes.

The numerical software used in this study is SEMCAD X. The input power in the simulation is 32.52 W and 13.77 W for the 1.5 T and 3 T modes, respectively, so that the incident electric field at the central point in the resonator is same as the point which is 2 cm from the left wall of the ASTM phantom, and central with respect to the other two directions—this location is suggested by ASTM F2182 to test the RF heating caused by medical implants—when the whole body SAR in the ASTM phantom is 2 W/Kg. The corresponding RMS values of the electric field are 115.2 V/m and 91.4 V/m, for the 1.5 T and 3 T units, respectively.

The measurement results were obtained with different power and normalized to the same input power as in the simulation (32.52 W and 13.77 W for the 1.5 T and 3 T modes, respectively) by the calorimetry method, as suggested in the ASTM 2182 standard.

Figure 9A:
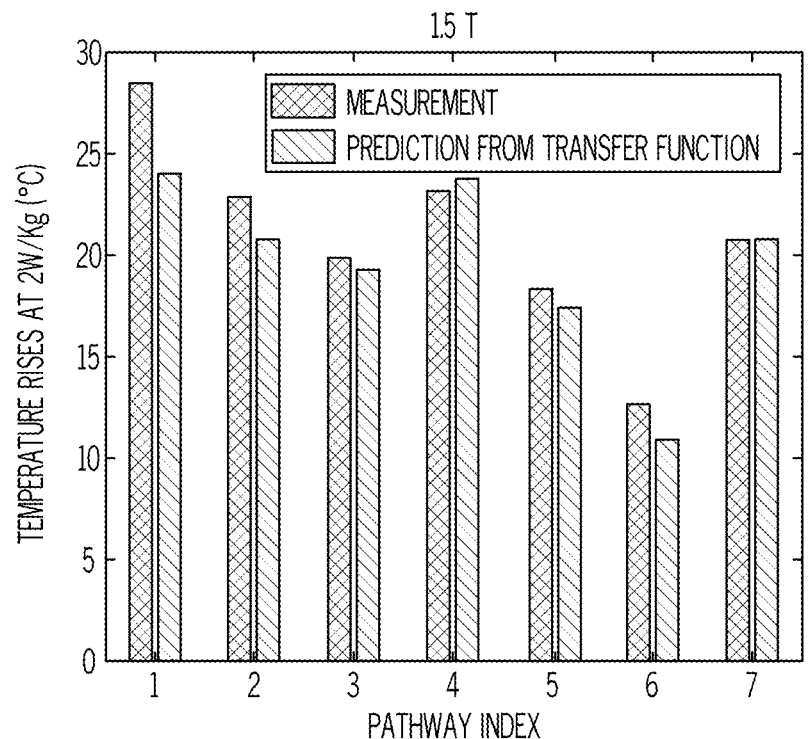
FIGS. 9A-9B illustrate comparison of temperature rises at the lead tip electrode derived from measurement and the prediction by transfer function for 40 cm AIMD at (FIG. 9A) 1.5 T and (FIG. 9B) 3 T.
Figure 9B:
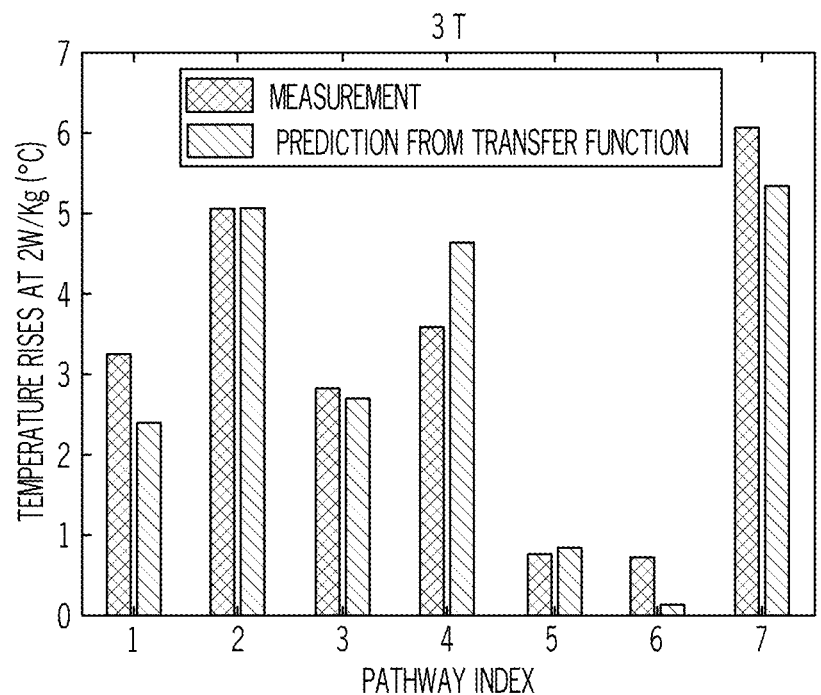

For the 40 cm AIMD, the simulated tangential electric field distributions along seven pathways are shown in FIGS. 8A-8D. The condition numbers of the 1.5 T and 3 T electric field matrices are 3.41 and 4.23, respectively. The comparison of temperature rises obtained from direct measurements and that predicted by the transfer function method is shown in FIGS. 9A-9B. For the 1.5 T validation tests, all of the pathways have a great fit with respect to criteria (2) since the highest background heating in the gel when the lead is absent during the same period is 0.47° C. For the 3 T test, with a background heating of 0.30° C., pathway 5 has the lowest SNR of 4.4 dB, except pathway 6, for which the predicted temperature rise (0.12° C.) is lower than the background heating. That makes pathway 6 an ineffective validation test. From Equation 1, the temperature rise is the complex cumulation of the product of the transfer function and incident electric field. The low heating value is often related to field cancellation due to the phase shift. Overall, they are still good validation pathways based on the three pathway selection criteria.

For the 30 cm AIMD, the pathways shown in FIG. 5 can still be applied for the 1.5 T transfer function validation, with the only change being a shortening of the single segment length from 5 cm to 3.5 cm. To minimize the influence of the fringing field, the middle point of the 30 cm AIMD should be at the central position in the resonator. The validation result for 1.5 T is given in FIG. 10A. The worst SNR appears in pathway 4, but it still larger than 10 dB. However, for the 3 T validation, the performance of the prototype pathway deteriorates dramatically, since pathways 1, 2 and 6 would have predicted temperature rises of (0.12, 0.25, and 0.12° C.) which are similar to the background heating (0.30° C.). Thus, further modification is needed for the 3 T test for the 30 cm AIMD.

Based on this argument, the z-directional segments in the second half of each pathway in FIG. 5 are flipped upward so that a reversed phase can be achieved. The modified pathways are illustrated in FIG. 11. The condition numbers of the 1.5 T and 3 T electric field matrices are 3.23 and 7.88, respectively. With the modified pathways, the SNR improved significantly. The validation result for the 3 T mode is shown in FIG. 10B. The worst SNR (pathway 3) is higher than 8.6 dB.

Uncertainty analysis. Following the recommended strategy by ISO/TS 10974 Ed. 1 Annex R, the uncertainty in the validation test needs to be quantified using the GUM method. The uncertainty sources in this test can be categorized into two parts: (1) the uncertainty from the transfer function model prediction, including the transfer function measurement; and (2) the uncertainty from the transfer function validation, including the numerical simulation and the temperature rise measurement. The proposed model (Equation 1) is a conservative calculation model for the temperature rises, since as the temperature of the tissue or the gel increases, both the specific heat and the thermal conductivity will rise. Therefore, the change in the thermal properties is also considered as an uncertainty source included in the "temperature rise measurement" part. More details can be found in the Appendix section following the conclusion of this Example.

The uncertainty specification for the 1.5 T and 3 T tests is given in Table I and Table II. The combined plot of the measured and predicted temperature rises, as well as the uncertainty boundary, as shown in FIGS. 12A-12B. It can be noticed that all measurement-prediction pairs locate within the $\Delta T(1\pm 2\sigma)\pm 1°$ C. region, for both the 1.5 T and 3 T tests.

TABLE I

UNCERTAINTY SPECIFICATION FOR 1.5 T TEST

| 1.5 T | Source of uncertainty | Uncertainty in % |
|---|---|---|
| Uncertainty for TF[a] model prediction | TF measurement | 1.85 |
| Uncertainty for TF model validation test | Temperature rise measurement | 9.61 ± 1.0° C. |
| | Numerical simulation | 2.17 |
| Combined Uncertainty | | 10.02 ± 1.0° C. |

[a]TF is the abbreviation for the transfer function.

TABLE II

UNCERTAINTY SPECIFICATION FOR 3 T TEST

| 3 T | Source of uncertainty | Uncertainty in % |
|---|---|---|
| Uncertainty for TF[a] model validation test | TF measurement | 1.29 |
| Uncertainty for TF model validation test | Temperature rise measurement | 18.27 ± 1.0° C. |
| | Numerical simulation | 4.78 |
| Combined uncertainty | | 18.92 ± 1.0° C. |

[a]TF is the abbreviation for the transfer function.

Example 1.4. Discussion

The preceding case studies show that the proposed instrument can be an alternative system to perform RF-safety assessment for AIMDs. It has three main advantages over conventional RF coils. (1) It is more compact due to the integration of the 1.5 T and 3 T cases. (2) It has a more uniform electric field distribution which lowers the uncertainty due to the lead pathway shift. (3) The electric fields along different pathways used in this strategy is more highly orthogonal to each other than those recommended by ISO 10974.

To demonstrate the second advantage, the uncertainty due to the lead pathway shift in an ASTM rectangular phantom and the proposed resonator is compared. For the ASTM phantom, the first three pathways of 40 cm in FIG. 5, are shifted in three directions by 10 mm, to obtain the predicted temperature rise perturbation using Equation 1. The transfer function is assumed to be constant. For the resonator, the same pathways are also shifted in three directions by 10 mm, to obtain the resulting change of calculated temperature rises. The average of three pathways' sensitivity coefficients in three directions and the combined results, as well as the uncertainty due to the shift of the pathway are given in Table III. It shows that the 3 T mode would be more sensitive to the effect of pathway shifting for both the proposed system and RF coils. However, due to the higher homogeneity of electric field distribution, the new system has superior performance on the uncertainty caused by pathway shifting at both frequencies.

TABLE III

THE UNCERTAINTY DUE TO THE SHIFT OF THE PATHWAYS FOR THE PROPOSED SYSTEM AND RF COIL AT 1.5 T AND 3 T

|  |  | Proposed system | | RF coils | |
| --- | --- | --- | --- | --- | --- |
|  |  | 1.5 T | 3 T | 1.5 T | 3 T |
| Sensitivity | X direction | 0.09 | 0.11 | 1.66 | 0.74 |
| coefficients | Y direction | 0.39 | 1.36 | 1.90 | 5.09 |
| (/mm) | Z direction | 0.06 | 0.19 | 0.51 | 0.10 |
|  | Combination | 0.41 | 1.38 | 2.57 | 5.14 |
| Standard deviation of pathway shift |  | 10 mm | | | |
| Uncertainty in % |  | 4.06 | 13.79 | 25.68 | 51.44 |

TABLE IV

THE CONDITION NUMBERS OF THE INCIDENT ELECTRIC FIELD MATRIX EXTRACTED ALONG THE PROPOSED PATHWAYS IN THE RESONATOR AND THOSE RECOMMENDED ONES BY ISO 10974 IN RF COILS

|  | Proposed pathways | Recommended pathways by ISO 10974 |
| --- | --- | --- |
| 1.5 T | 3.41 | 118.63 |
| 3 T | 4.23 | 71.54 |

To illustrate the third advantage, the correlation among the pathways presented in this paper and those recommended by ISO 10974, as shown in FIG. 13, are compared. The 40 cm pathways are used for comparison. The quadrature excitation mode for the 1.5 T and 3 T coils is selected. For seven validation pathway sets of the two methods, the condition numbers of the incident electric field matrix are given in Table IV. It shows that the electric field along the pathways used in this paper has significantly higher orthogonality than those recommended pathways used in RF coils for both working frequencies.

Example 1.5. Conclusion

This Example proposes an efficient validation strategy for transfer functions for AIMDs. Applying a high electric field generating system and a set of validation pathways along which the electric field is orthogonal, this strategy could be an alternative to the recommended one in ISO 10974. There are three advantages of new strategy: first, it is more compact due to the integration of the 1.5 T and 3 T cases; second, it achieves lower uncertainty caused by the shift of pathways compared to a RF coil resulting from the higher electric field homogeneity; and third, the orthogonality of the electric field along different pathways is significantly improved by a set of designed pathways inspired by the Hadamard matrix. From two AIMD studies, the prototype in FIG. 5 could provide initial pathways to perform the transfer function validation test. However, modification is potentially needed if the prototype does not satisfy design criterion (2), the SNR requirement.

Example 1.6 Appendix

The detail of uncertainty analysis for the proposed system is shown as follows. The uncertainty of type B is derived from the measurement instruments' specification for the NI network analyzer and temperature measurement system. To determine the uncertainty of type A, pairs of numerical simulations with only a single parameter variation have been executed. Two realistic values "V1", and "V2" are chosen for each variable as shown in Table VIII. A linear dependence of the measurement values on the changing parameter is assumed. The sensitivity factors $f_i$ for each parameter can be determined. The standard deviation $s_i$ is derived based on the measurements. The product of the sensitivity factor and the corresponding standard deviation is the uncertainty contribution of this parameter. The combined uncertainty at the 1 sigma-level can be calculated using the formula $\sqrt{\Sigma(s_i f_i)^2}$.

TABLE V

THE UNCERTAINTY OF TRANSFER FUNCTION MEASUREMENT

| Source of uncertainty | Uncertainty type | 1.5 T Uncertainty in % | 3 T Uncertainty in % |
| --- | --- | --- | --- |
| Mutual coupling between VNA ports | B | 0 | 0 |
| VNA drift | B | 1.16 | 1.16 |
| Liquid conductivity | A | 1.41 | 0.19 |
| Liquid permittivity | A | 0.29 | 0.54 |
| Combined Std. | — | 1.85 | 1.29 |

TABLE VI

THE UNCERTAINTY OF TEMPERATURE RISES MEASUREMENT

| Source of uncertainty | Uncertainty type | 1.5T Uncertainty in % | 3T Uncertainty in % |
| --- | --- | --- | --- |
| Liquid conductivity | A | 7.56 | 11.38 |
| Liquid permittivity | A | 0.85 | 0.33 |
| Leads path | A | 4.06 | 13.79 |
| Gel height | A | 1.58 | 2.18 |
| Liquid thermal conductivity | A | 2.73 | 2.73 |
| Liquid specific heat | A | 1.36 ± | 1.36 ± |
| Readout electronics | B | 1.0° C. | 1.0° C. |
| Combined Std. | — | 9.61 ± 1.0° C. | 18.27 ± 1.0° C. |

TABLE VII

THE UNCERTAINTY OF NUMERICAL SIMULATION

| Source of uncertainty | Uncertainty type | 1.5T Uncertainty in % | 3T Uncertainty in % |
|---|---|---|---|
| Grid resolution | A | 2.08 | 0.80 |
| Dielectric box relative permittivity | A | 0.61 | 4.71 |
| Combined Std. | — | 2.17 | 4.78 |

TABLE VIII

THE DETAILS OF UNCERTAINTY SOURCE (UNCERTAINTY TYPE A ONLY)

| Uncertainty category | Parameters | Quantity | V1 | V2 | Standard deviation | 1.5 T Sensitivity factor | 1.5 T uncertainy in % | 3 T Sensitivity factor | 3 T uncertainy in % |
|---|---|---|---|---|---|---|---|---|---|
| Transfer function measurement | Liquid conductivity | TF | 0.47 S/m | 0.517 S/m | 0.033 S/m | 42.69 | 1.41 | 5.69 | 0.19 |
| | Liquid permittivity | TF | 80 | 88 | 2.85 | 0.10 | 0.29 | 0.19 | 0.54 |
| Numerical simulation | Grid resolution | $E_{incid}$ | 2 mm | 4 mm | 2 mm | 1.04 | 2.08 | 0.40 | 0.80 |
| | Dielectric box relative permittivity | $E_{incid}$ | 2.25 | 3 | 0.75 | 0.81 | 0.61 | 6.28 | 4.71 |
| | Liquid conductivity | $E_{incid}$ | 0.47 S/m | 0.517 S/m | 0.033 S/m | 229.11 | 7.56 | 344.86 | 11.38 |
| | Liquid permittivity | $E_{incid}$ | 80 | 88 | 2.85 | 0.30 | 0.85 | 0.12 | 0.33 |
| Temperature rises measurement | Liquid thermal conductivity | T | 0.42 W/(m·k) | 0.5 W/(m·k) | 0.02 W/(m·k) | 136.67 | 2.73 | 136.67 | 2.73 |
| | Liquid specific heat | T | 4159 J/(kg·k) | 4206 J/(kg·k) | 160 J/(kg·k) | 0.01 | 1.36 | 0.01 | 1.36 |
| | Leads path | $E_{incid}$ | 0 mm | 10 mm | 10 mm | 0.41 | 4.06 | 1.38 | 13.79 |
| | Gel height | $E_{incid}$ | 9 cm | 9.5 cm | 0.2 cm | 7.92 | 1.58 | 10.89 | 2.18 |

Example 2. Dual-Frequency High Electric Field Generator for Magnetic Resonance Imaging (MRI) Safety Testing of Passive Implantable Medical Devices In this Example, an electric (E) field generator is developed to generate uniform and high strength E-fields at multiple frequencies. The system can be used to assess radio frequency (RF) hazards of implantable medical devices (IMDs) in magnetic resonance imaging (MRI) environments. The novel system includes three parts, (i) a signal generating and amplifying block, (ii) a four-channel feeding network, and (iii) a rectangular resonator box. Mixed modes are utilized to generate locally uniform E-fields inside the rectangular resonator at both 64 MHz and 128 MHz, respectively. RF-induced heating for two passive IMD families are evaluated using both numerical and experimental methods inside the E-field generator. These results are compared with those obtained from standard ASTM phantom testing. The results show that the novel E-field generator is capable of evaluating RF-induced heating for passive IMDs similar to that of the ASTM phantom. Furthermore, it integrates both 1.5T and 3T RF-induced heating tests in a single system. It is much simpler compared to the ASTM test method which needs the RF coil as a source. Consequently, this small and efficient E-field generator can be used as an alternative system for RF-induced heating tests of passive IMDs in the MRI environment.

Example 2.1. Introduction

Magnetic resonance imaging (MRI) is a widely used imaging method due to its non-invasive nature and high image quality. During the MRI procedure, radio frequency (RF) signals penetrate the human body and interact with the tissues. For patients with electrically conductive implantable medical devices (IMDs), the conductive parts will interact strongly with the electromagnetic (EM) fields and lead to localized RF energy deposition in tissues near the IMDs. There are numerous reports about patient burn incidents and influences on IMDs function caused by such highly concentrated power deposition. Although direct in-vivo MRI RF-induced heating measurement methods can potentially be used for safety assessment, in-vitro investigation of RF-induced heating and design optimization are still needed before the IMDs can be implanted as an MR Conditional device. Such MR Conditional devices allow the patient to safely undergo an MRI scan under very specific conditions. In many cases, the in-vitro measured heating data are directly used to label an IMD MR Conditional.

Currently, performing RF-induced heating tests based on the ASTM standard requires a large sized RF coil for each frequency to be studied and a high-power supply system together with a large shielded room. Such RF coils are available as part of MRI systems or equivalent test systems based on birdcage coils or TEM coils. Due to potential differences in coil types and coil sizes, local incident field calibration is required. Additionally, the linear variation of the E-field along the radial direction inside the ASTM phantom in a typical RF birdcage coil will limit the test region to achieve a high signal to noise ratio. The limited test region also requires accurate IMDs positioning systems to reduce experimental uncertainty.

Due to these limitations and with "new knowledge about RF-induced heating related to the presence of an implant in a patient undergoing an MRI examination", the new American Society of Testing and Materials (ASTM) F2182-19e$^2$ focusing on local exposure was developed. The new 19e$^2$ standard is "focusing the analysis on local exposure, rather than whole-phantom calorimetry". The in-vitro test is aimed to characterize the heating behavior of the IMD family "under the well-characterized incident field", find the possible worst-case conditions, and then reasonably infer, or numerically predict, the RF-induced heating in actual in-vivo scenarios when an IMD is implanted inside a human body. Furthermore, "The phantom geometry has been further simplified and provided only as a possible example, allowing other geometries as well". All these indicates that if one can develop a test system with well-characterized local exposure, it can also be used to assess the RF-induced heating for IMDs.

Since the test locations recommended in the ASTM standard suggests that the E-fields generated by the RF coil is mainly aligned with the bore direction, typically indicated as z-direction, the quantitative heating measurements essentially capture the interaction of the IMD with E-fields in this direction. Therefore, efficient in-vitro assessment of RF-induced heating requires a strong local E-field and a well-characterized background heating.

Various types of field generating equipment has been developed for (i) electromagnetic compatibility (EMC) tests for active IMDs, (ii) open area test of electrically powered medical devices, and (iii) immunity testing of medical devices using wireless communications. A transmission line system (TLS) is recommended in the ISO 11451-2 standard. This TLS uses terminated transmission line elements to generate EM fields between the conductors and the shielded structures. However, the system requires a large chamber; additionally, the radiated fields have the risk of coupling with the chamber enclosure. Another TLS based design has been proposed to generate high-intensity EM fields over a wide frequency range, but the strength of the generated field changes dramatically in the test region. Others have reviewed other transmission line-based designs and suggested that open transverse electromagnetic (TEM) lines, like parallel plate guides, are faced with problems of radiation and coupling with the shielded room, while enclosed TEM lines, which have a closed structure and inside radiating elements, will make the experiments complex. The gigahertz TEM cell is also widely used in EMC tests, however, the variation of the field strength will be too large to perform stable heating measurements for IMDs. For medical devices the ISO-10974 standard proposes a trough line resonator design. This device is designed to generate ultra-high fields for testing electrically short IMDs. However, the enclosed resonator structure requires a fixed length at the desired frequency, making it not suitable for a multi-frequency capable system. Other antenna-based designs, including Bilog antennas, are able to generate a strong uniform field, but have the disadvantage of low power efficiency and require large chambers for operation.

This Example illustrates a design, a build, a calibration, a test, and comparison to the ASTM F2182 test method. This Example demonstrates a novel dual-frequency uniform E-field generator for 64 MHz and 128 MHz. For practical considerations, a high strength uniform E-field constrained to the inside of a rectangular box is desirable. The EM field in such a resonance structure can be characterized by transverse electric (TE) modes based on the cavity model.

In the proposed design, mixed TE modes of the rectangular resonator are used to generate a uniform E-field at 64 MHz and 128 MHz. The dimensions of the E-field generator are chosen as a tradeoff between (i) field homogeneity for dual-frequency capability, (ii) power efficiency, and (iii) sufficient space to test typical IMDs. The dual-frequency-in-one design requires lumped elements circuits to match the resonator at varying frequencies. Compared to the ASTM standard test system, using the ASTM phantom driven by an RF coil, the new design has the advantage of low cost, less sensitivity to IMD positioning error, ease of fabrication and operation, and most importantly, integration of both 1.5T and 3T RF-induced heating tests into one single system.

This Example presents the design and development of the novel E-field generator, including (i) numerical simulations, (ii) experimental validation, and (iii) system calibration at 64 MHz and 128 MHz. Further, the Example provides numerical simulation results of the RF-induced heating for two IMD families and positioning error analysis on a selection of IMDs. RF-induced heating measurements on a selection of IMDs were performed in the E-field generator and the ASTM phantom and compared to each other below. These results are then discussed and a conclusion presented.

Example 2.2. Multi-Frequency E-Field Generator

In this section, the development of an example multi-frequency E-field generator system is described. It is followed by the calibration procedures which include both total input power calibration and local 10 cm titanium calibration procedure. The validation of the incident field generated by the system is then presented.

Design of the Multi frequency E-field generator. There are several key requirements that should be met to accomplish reliable and efficient measurements: (1) to meet the ASTM RF-induced heating test requirements, the E-field generator needs to generate a sufficiently high E-field along the longitudinal direction of the transverse plane (z-direction) similar to that at the test location inside the ASTM phantom; (2) generate a uniform E-field to minimize the positioning error; (3) be accessible from the top so that the test devices can be accurately positioned and inspected; and (4) be large enough to accommodate IMDs of typical sizes used in clinical settings.

A rectangular shaped box, shown in FIG. 2A, was developed for this Example. The central region of this box is then filled with gelled saline. As prescribed in the ASTM standard, the gelled saline should have a relative permittivity of 78 and an electrical conductivity of 0.47 S/m. The corresponding wavelengths for 1.5T and 3T systems are around 45 cm and 22 cm, respectively. By attaching copper-clad, flexible circuit boards with excitations to the sidewalls of the box, a cavity can be formed if appropriate cavity modes treat the top/bottom surfaces as perfect magnetic conductors. The top side of the gel box is open. To generate a uniform E-field along one direction of the transverse plane (x-z plane), the $TE_{10}$ mode is utilized for 64 MHz. The dimension of 300 mm by 300 mm is chosen along the x- and z-directions so that the resonance frequency of the $TE_{10}$ mode is around 64 MHz and there will be enough space to place typical IMDs. As the frequency of the 3T MRI increases to 128 MHz, high order modes, such as the $TE_{20}$ and $TE_{12}$ modes will have noticeable strength.

To minimize the influence of these high order modes, several methods are used. First, the dimensions of 300 mm by 300 mm are chosen to suppress the higher modes, and second, a special 4-way feeding network is developed. Four gaps are cut on the left and right walls near the four corners of the box. SMA connectors are connected to the gaps to form even and differential excitations between the front (+z) and back (−z) box walls, as shown in FIG. 2A. Two gaps on the cavity's front and back walls are cut for decoupling the left (−x) and right (+x) channels. Such a feeding network ensures that only modes with major E-field components along the z-direction can be excited and the E-field of those modes will be symmetric with respect to both the x-axis and z-axis.

FIG. 2B illustrates the schematic of the system. The signal from a signal generator is amplified using a power amplifier (ZHL-100W-52-S+ from Mini-Circuits) supplied with a direct current (DC) power source. The RF signal travels through the power divider into a lumped-element matching circuit ('L' type). The output signals of a four-way power divider (H4S-0.252 WWP from Meca Electronics) with the same magnitude and phase are connected to SMA connectors attached on the wall using coaxial cables. A special four-way feeding network is acquired by exciting the front (+z) and back (−z) walls differentially as shown in FIG. 2B. The front (+z) copper plates are connected to the outer conductor of the SMA connector, while the copper plates on the back (−z) wall are connected to the inner conductor of the SMA connector.

Full-wave numerical simulations are performed to assistant the design. Such electromagnetic simulations were performed using the commercial FDTD software SEMCAD X (ZMT, Zurich, Switzerland). Copper plates on the acrylic box are modeled as perfect electric conductor (PEC) on a dielectric box with a relative permittivity of 2.25 and an electrical conductivity of 0 S/m). The copper plates are modeled as ideal PEC with no thickness, the wall of the acrylic box is 12.5 mm thick, and the box outer dimensions are 300 mm by 300 mm by 120 mm. The SMA excitations are modeled as lumped sources, the gelled saline is modeled as a lossy dielectric material (relative permittivity=78, electrical conductivity=0.47S/m), the height of the gel is 90 mm, and the grid resolution of the simulation is 2.0 mm.

The matching circuit is modeled as lumped elements in series with the sources. Broadband simulations were performed to match the resonator at 64 MHz and 128 MHz for the 1.5T and 3T MRI systems. As shown in FIGS. 14A-B, it was observed that the $S_{11}$ values were below −10 dB, and the S2, values were below −15 dB. The numbering of the ports is shown in FIGS. 2A-2B. The reflection and coupling of other ports are not shown since the structure is symmetric.

Based on the designed structure, electromagnetic simulations were performed for the two frequencies and the E-field distributions are shown in FIGS. 15A-D. The input power in the simulations are normalized to 32.52 W at 64 MHz and 13.77 W at 128 MHz respectively, so that the induced E-field in the generator will be equivalent to the E-field at the test in a standard ASTM phantom location (around 111 V/m (64 MHz) and 91 V/m (128 MHz)) when the whole-body averaged phantom SAR is normalized to 2W/kg.

As shown in FIGS. 15A-D, for 1.5T (64 MHz), the E-field distribution is similar to that of a $TE_{10}$ mode, whereas for 3T (128 MHz), the E-field distribution is similar to a combination of a $TE_{10}$ and a $TE_{21}$ modes. However, in both cases relatively uniform E-field distribution can be achieved in the center on the E-field generator.

The Q factor is assessed based on the stored energy and the consumed energy per period, the comparisons of the results and those from the analytical calculation are shown in Table IX. The main loss of the system is due to the power dissipation in the gel, the major contribution of the Q factor is from conductivity loss as:

$$Q_d = \frac{1}{\tan\delta} \qquad \text{(Equation 2)}$$

TABLE IX

Q FACTORS COMPARISON

| | Dielectric loss/W | Frequency/ MHz | Stored energy/J | $Q_{simulation}$ | $Q_{theoretical}$ |
|---|---|---|---|---|---|
| 64 MHz | 32.34 | 64 | 5.41e−8 | 0.67 | 0.61 |
| 128 MHz | 13.64 | 128 | 2.24e−8 | 1.32 | 1.17 |

$$\tan\delta \approx \frac{\sigma}{\omega * \varepsilon_0 \varepsilon_r} \qquad \text{(Equation 2)}$$

where σ is the electrical conductivity of phantom material (σ=0.47 S/m), ω is the angular frequency (ω=2*π*64 MHz for 1.5T; ω=2*π*128 MHz for 3T), $\varepsilon_0$ is the vacuum permittivity, $\varepsilon_r$ is the permittivity of the gel ($\varepsilon_r$=78).

The Q factor ($Q_s$) can be obtained using:

$$Q_s = \frac{\omega_0' U}{P_d^{ave}} \qquad \text{(Equation 3)}$$

where U is the stored energy, $P_d^{ave}$ the averaged power dissipated, and $\omega_0'$ is the real angular frequency.

Experimental validation of the design. To experimentally validate the E-field distributions inside the generator an E-field probe (Easy4MRI, ZMT, Zurich, Switzerland) was placed inside the generator at 49 locations (at the vertical center slice of the gel) as shown in FIG. 16. These 49 positions were chosen with a step size of 25 mm along the x- and z-direction. The E-field generator was filled with 90 mm gel and the E-field probe was placed 45 mm under the gel surface.

Comparisons of the E-fields obtained by direct measurement and simulation are shown in FIGS. 17A-D. All results shown here are for a net input power of 32.5W for 64 MHz and 13.8W for 128 MHz. Using this power levels, the E-field at the center of the generator will be similar to those at the ASTM recommended device testing location when a whole-body averaged phantom SAR of 2 W/kg is used. In the simulation the input power is calculated using the S parameter from the source sensors; the measurements are calibrated using the calorimetry method as suggested in the literature. As clearly shown in FIG. 16, the results obtained by experimental measurements were in good agreement with those from simulations for both the 1.5T (FIG. 15A) and 3T (FIG. 15B) systems. Such results validated this design.

Calibrations of the dual-frequency E-field generator. Two calibration procedures should be used to ensure the local E-field in the generator will be similar to those in the ASTM phantom. The first calibration procedure is referred to as the input power calibration which follows the calorimetry procedure described in the literature. The second calibration procedure follows the procedure of local exposure estimation based on the literature.

For the input power calibration, the following steps performed: (1) Fill the E-field generator with 90 mm saline (not gelled) with a relative permittivity of 78, an electrical conductivity of 0.475/m, and a weight of 6.85 kg. (2) Cover the E-field generator with a thermal insulation lid to avoid evaporation and cooling of the saline which can produce a measurement error; leave the lid on the top of the E-field generator. (3) Measure the temperature at the center of the saline using a fiber probe until the temperature is stable (variation less than ±0.5° C.). (4) Cover the entire system with thermal insulation material and apply the power for 900s. (5) Stop the power input, quickly stir the saline, measure the saline temperature rise with fiber probe. (6) Calculate the total deposited power in the saline using:

$$P = c * m * \frac{\Delta T}{\Delta t} \qquad \text{(Equation 4)}$$

where c is the specific heating capacity of the saline, c=4150 J/kg/K, m is the mass of the saline which is 6.85 kg, $\Delta T$ is the temperature rise of the saline, $\Delta t$ is the heating time which is 900s.

Based on the procedure described above, one can generate the required power following the calibration curve as shown in FIG. 18. As shown in the figure, the target deposition power inside the phantom should have corresponding temperature rises around 1.03° C. at 64 MHz and 0.45° C. at 128 MHz to generate an incident E-field of 111 V/m at 64 MHz and 91 V/m at 128 MHz.

In addition, a local exposure calibration should also be performed using a 3.2 mm×10 cm titanium-alloy rod. Due to potential signal source drift and power amplifier variation between each experiment, the incident E-field at the center location of the generator can have slight variation. These variations should be captured through local exposure measurements. Therefore, before each device measurement, a five-step local energy calibration procedure as described in the literature should be performed. In the test, the gelled saline should be used to fill the E-field generator to 90 mm. Temperature rises for 6 minutes are measured near both ends of the titanium-alloy rod. The local SAR estimations (in terms of W/kg) should be estimated by $\Delta T_{360}/1.3$ at 64 MHz and $\Delta T_{360}/1.45$ at 128 MHz.

Example 2.3. Numerical Studies of RF-Inducted Heating for IMDs

To show the equivalency of the RF-induced heating measurement between the E-field generator and the ASTM standard test system, two sets of IMDs were placed inside the E-field generator and the ASTM phantom (driven by an MRI RF coil). For the purpose of comparison, the 1 g averaged specific absorption rate (SAR) was assessed. During the RF-induced heating measurements in the E-field generator, the IMDs were placed at the center of the E-field generator, with the long axis of all devices aligned with the z direction.

The two device families used in this investigation are shown in FIGS. 19A-B. The first IMD family consists of fully threaded compression screws of different lengths and diameters. The second IMD family consists of plates and screws from a typical trauma product. Nine plates with different dimensions were loaded with different numbers of screws.

The RF-induced heating of these devices when they were placed inside the E-field generator and the ASTM phantom were studied. Both the E-field generator and the ASTM phantom were filled with 90 mm of gelled saline. During the RF-induced heating in the E-field generator, the devices were placed at the center of the E-field generator. In all studies using the ASTM phantom, the devices were placed at the center of y- and z-axis and 20 mm from the left (−x) edge of the ASTM phantom where a high electric field strength can be found. In all the simulations, the IMDs are modeled as PECs, with a grid resolution of 0.5 mm.

In the RF-induced heating measurements using the ASTM phantom and an RF coil, the MRI RF coils were the MITS 1.5T system (ZMT, Zurich, Switzerland) and a standard commercial 3T RF coil. The dimensions of these coils are given in Table X. In addition, two generic coil models were also used in the simulations. The simplified generic coils models were referred to as H8 coils. They have hard current excitations on the legs of the coils. By varying the phase of those sources, the circular polarized (CP) mode can be generated. The dimensions of all physical and generic coils are shown in Table X.

TABLE X

DIMENSIONS OF THE COILS USED IN THE SIMULATION

|  | 1.5 T Physical | 3 T Physical | 1.5 T Generic | 3 T Generic |
| --- | --- | --- | --- | --- |
| Coil radius (mm) | 350 | 305 | 315 | 315 |
| Coil length (mm) | 650 | 550 | 650 | 650 |
| Shielding length (mm) | 425 | 320 | N/A | N/A |
| Shielding length (mm) | 850 | 1450 | N/A | N/A |
| Number of legs | 16 | 16 | 8 | 8 |
| Excitation type | IQ | IQ | H8 | H8 |

An illustration of those coils is shown in FIG. 20A and FIG. 20B. The comparisons of simulation results for RF-induced energy near the devices is shown in FIGS. 21A-B, and, all the SAR values shown in the tables and figures were spatially averaged over a mass of one gram (1 g). The input power of the ASTM system is normalized to a whole-body averaged SAR of 2 W/kg. Results obtained from the E-field generator were calibrated to the incident E-field at the device test location inside the ASTM phantom. As clearly shown in FIGS. 21A-B, the E-field generator can produce similar energy deposition near the devices as those produced in the standard ASTM phantom.

A sensitivity analysis was then performed to understand the impact the device positioning error has on the energy deposition near the IMDs for both the ASTM method and the E-field generator. For the worst-case heating IMDs from each family, the IMDs are moved away from the center −10 mm, −5 mm, 5 mm and +10 mm along the x, y, and z axes. EM simulations were performed for the E-field generator and the ASTM phantom. FIGS. 22A-F shows the results for screw 2-6 at 64 MHz and screw 1-3 at 128 MHz. FIGS. 23A-F shows the results for plate 3-5 at 64 MHz and plate 3-4 at 128 MHz. As can clearly be seen from these data, the newly designed E-field generator has similar sensitivity of the device positioning error along the z-direction as the ASTM phantom. However, the device positioning errors in the E-field generator along the x- and y-directions are much smaller than in the ASTM phantom. Overall the E-field generator clearly outperforms the ASTM phantom in measurement uncertainty, power consumption, simplicity, size, and price.

Example 2.4. Experimental Validation of Temperature Rises

Based on the design presented above, a prototype of the E-field generator was developed as shown in FIG. 24. IMDs were placed inside this test generator and the RF-induced heating was measured. In all measurements, the temperature probes were placed at the maximum heating location based on the modeling results. For comparison, thermal simulations were also obtained using Pennes' bioheat based thermal solver in SEMCAD X. In both modeling and measurement, the RF power was turned on for 15 minutes. Temperature rises in both modeling and measurements are shown in Table XI. All results are normalized a whole-body averaged SAR of 2W/kg for the ASTM phantom. For the E-field generator, the input power is chosen to generate an equivalent E-field. In both settings, the incident E-field at the device test location was 111 V/m 64 MHz and 91 V/m at 128 MHz.

TABLE XI

COMPARISON OF MEASURED AND SIMULATED TEMPERATURE RISES FOR BOTH 1.5 T AND 3 T

| Part Number | E-field generator | | | ASTM phantom | | |
|---|---|---|---|---|---|---|
| | Modeling $\Delta T/°C$. | Measured $\Delta T/°C$. | Difference /% | Modeling $\Delta T/°C$. | Measured $\Delta T/°C$. | Difference /% |
| 1.5 T (64 MHz) | | | | | | |
| 1-3 | 9.85 | 8.55 | 15.21 | 7.96 | 8.19 | −2.76 |
| 2-4 | 11.96 | 11.13 | 7.48 | 9.38 | 9.34 | 0.48 |
| 2-6 | 15.36 | 15.22 | 0.91 | 11.8 | 10.79 | 9.37 |
| 3-4 | 14.08 | 13.01 | 8.23 | 11.8 | 10.10 | 16.86 |
| 3-5 | 16.68 | 15.24 | 9.41 | 15.3 | 12.60 | 21.42 |
| 3 T (128 MHz) | | | | | | |
| 1-3 | 7.76 | 6.73 | 15.29 | 7.22 | 7.86 | −8.14 |
| 2-4 | 6.33 | 5.58 | 13.38 | 6.58 | 6.55 | 0.48 |
| 2-6 | 4.05 | 3.27 | 23.88 | 4.66 | 3.95 | 18.03 |
| 3-4 | 5.21 | 4.59 | 13.43 | 5.43 | 6.98 | −22.19 |
| 3-5 | 1.82 | 1.70 | 7.06 | 2.97 | 2.60 | 14.23 |

As shown in Table XI, measured temperature rises are consistent with the results from simulations at both frequencies for both the E-field generator and the ASTM phantom. As shown in the table, relatively large errors were observed for devices longer than the ½) wavelength, which will be explained below.

Example 2.5. Discussion

From the results presented in FIGS. 21A-B it can be seen that the induced SAR for most devices in the two IMD families at both 64 MHz and 128 MHz show a good agreement between the two different test systems. However, relatively large differences were observed for the longer devices 2-6, 3-4, and 3-5 at 64 MHz as shown in the numerical simulations (FIGS. 21A-B) and the experimental experiments (Table XI). Such relatively large differences are due to the E-field variations along the z-direction, as well as the potential interaction between the IMD and the E-field generator. In the ASTM phantom the E-field along the z-direction has a better uniformity than in the E-field generator since the E-field generator uses higher order modes. To achieve better agreement between the E-field generator and the ASTM phantom, the z-direction of the E-field generator can be extended which will lead to a better E-field uniformity. Currently, the RF-induced heating of the 10 cm titanium rod is used to calibrate the local exposure. Using this calibration method, it was found that for an IMD with a maximum length of less than 15 cm, the results obtained in the ASTM phantom and the E-field generator agree very well with each other. This agrees with the ASTM standard requirement that a 15 cm uniform incident E-field should be generated. Alternatively, one can develop better calibration parameters so that the averaged E-field along the z-direction is considered as a function of device length. Using this calibration, a better agreement can be achieved. However, this is beyond the current calibration procedure described in the ASTM standard.

From the results shown in FIGS. 22A-F and FIGS. 23A-F, it can be seen that the IMD positioning error along the z-direction would lead to negligible RF-induced heating differences. However, such differences can be magnified for positioning errors along the x- and y-directions in the ASTM phantom. As clearly indicated in the figures, a positioning error of 5 mm along the x- or y-direction in the ASTM phantom, can change the induced SAR by 15%. Such variation can increase to 30% with a 10 mm positioning error along with these two directions. However, such a positioning error has almost no impact on the RF-induced heating when the E-field generator is used. The newly designed system can provide more consistent measurement results since the heating measurement is not very sensitive to the positioning error along all three directions. Based on these observations and a current side length of 30 cm, it was observed that when the IMD overall length is less than ½ of the incident field wavelength, all results from measurement and modeling inside the ASTM phantom and the E-field generator agree well with each other.

Apart from the advantage of the measurement stability, the novel uniform E-field generator integrates both 1.5T and 3T testing into a single system without the need of an RF coil. In addition, using clinical, or clinically equivalent, MRI RF coils would require a large shielded room, a high-power amplifier, and a large footprint for the equipment. The novel uniform E-field generator has much smaller dimensions and requires less than 100W input power. This allows the E-field generator to become a desktop test system and an extremely useful alternative for IMDs MRI RF-induced heating measurements.

Example 2.6. Conclusion

This Example presented a novel design of a uniform E-field generator. The design was guided by the cavity model and validated using numerical methods. Experimental validations of the design were performed by measuring the E-field distribution within the generator and comparing it to simulation results. Two sets of IMD families were placed inside the E-field generator and the ASTM phantom for both modeling and measurement studies. From these studies, highly correlated results for both frequencies 64 MHz and 128 MHz were observed. In addition, the measured RF-induced heating is less sensitive to device positioning errors in the E-field generator. Compared to the conventional ASTM method using an RF coil and the ASTM phantom for testing, this novel E-field generator has a significant advantage in terms of low cost, low operation power, ease of operation, and most importantly, integration of 1.5T and 3T RF heating tests into a single desk-top system. This provides a better alternative to evaluate the RF-induced heating of IMDs under MRI exposure. It is observed that when the device length is less than ½ of the incident field wavelength, all results from measurement and modeling inside the ASTM phantom and the E-field generator agree within the combined uncertainty of 25%.

Example 3. Multi-Frequency High Electric Field System for Magnetic Field Imaging (MRI) Safety Test of Implantable Medical Devices This Example illustrates an efficient and improved electric field generator that is developed to generate uniform and high strength electric fields at multiple frequencies, designed to be used in the evaluations of radio frequency (RF) related hazards for implantable medical devices (IMDs) under magnetic resonance imaging (MRI).

This system presented in this Example can replace the current RF-coil/ASTM phantom configuration for device testing. It can potentially be included in the standard of ASTM-F2182 for implantable device safety evaluation.

Example 3.1. Introduction

To understand the implantable device behavior/safety under magnetic resonance (MR) RF field, RF-induced heating measurement/evaluation needs to be performed. Currently, this is solved by the device testing using (1) MR system and ASTM phantom or (2) RF-coil and ASTM phantom.

Two separate systems are required for 1.5T and 3T systems. MR systems would require over $1.5 million for 1.5T and $3 million for 3T. RF coils for both 1.5T and 3T typically would cost over $700,000.

3.2. Advantages of Proposed System

Compared to the ASTM standard test system, the design presented herein has the advantage of low cost, improved stability in measurement, ease of fabrication and operation, and most importantly, integration of both 1.5T and 3T RF heating tests into one single fixture. A short summary is given in Table XII below.

TABLE XII

COMPARISON OF CURRENT AND PROPOSED TESTING REQUIREMENTS FOR BOTH 1.5 T AND 3 T

|  | MR suites/ASTM | ASTMMR RF coil/ASTM | Proposed System |
|---|---|---|---|
| Power Requirement | 2.0 KW | 2.0 KW | <100 W |
| Space Requirement | 800 SF | 300 ST | 50 SF |

Example 3.3. Proposed Design

Illustration for the design improved is shown in FIGS. 25A-B. In the original design, the RF power was fed at four corner locations. The new design will ensure the excitation current is placed at the bottom of the phantom so that more uniformed field distribution can be achieved. An initial design and prototype are shown in FIGS. 26A-B. FIGS. 27A-B show the electric fields generated by the system has a good uniformity.

Because of the uniform electric field distribution in the entire region (in the depth direction), one can use double layered configuration for leads pathway designs. As shown in FIGS. 28A-B, the original pathway for validation can only be constructed on top of a mesh grid due to the field variation from the top and bottom grid. However, in the new phantom box design, one can design validation pathways on both top and bottom region of the grid. This allows for performing device validation for much longer medial devices, such as, for example, the Deep Brain Stimulus (DBS) system.

Without further elaboration, it is believed that one skilled in the art can, using the description herein, utilize the present disclosure to its fullest extent. The embodiments described herein are to be construed as illustrative and not as constraining the remainder of the disclosure in any way whatsoever. While the embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A method of determining radio frequency (RF)-induced heating on a medical device, the method comprising:
    determining a validation pathway;
    incorporating the validation pathway on a grid in an electric field generator, wherein the electric field generator comprises a power divider;
    incorporating the medical device in a central slice of a conductive composition within the electric field generator;
    applying power to the electric field generator;
    wherein the power divider facilitates the generation of a uniform electric field within the electric field generator;
    wherein the uniform electric field induces RF-heating within the medical device; and
    measuring a change in temperature of the medical device.

2. The method of claim 1, wherein the validation pathway is based, at least in part, on at least one of low correlations of electric fields along different pathways, generating high temperature rises for RF-induced heating, or mechanical design of the medical device.

3. The method of claim 1, wherein the electric field generator comprises:
   a first wall, a second wall, a third wall, and a fourth wall that form an enclosed shape having a cavity therein for housing the medical device;
   a base area at the bottom of the enclosed shape; and
   wherein the power divider is electrically connected to at least one of the first wall, the second wall, the third wall, the fourth wall, or the base area.

4. The method of claim 3, wherein the first wall and the second wall are on opposite sides of one another, wherein the third wall and the fourth wall are on opposite sides of one another, wherein the first wall and the second wall are spaced apart via the third wall and the fourth wall, and wherein the first wall and the second wall intersect with the third wall and the fourth wall to thereby form the enclosed shape.

5. The method of claim 1,
   wherein the power divider is electrically connected to an impedance matching circuit;
   wherein the impedance matching circuit is electrically connected to a power amplifier; and
   wherein the power amplifier is electrically connected to a signal generator.

6. The method of claim 4, wherein the power divider comprises a first output, a second output, a third output, and a fourth output;
   wherein the first output is electrically connected to the first wall and the third wall;
   wherein the second output is electrically connected to the first wall and the fourth wall;
   wherein the third output is electrically connected to the third wall and the second wall; and
   wherein the fourth output is electrically connected to the second wall and the fourth wall.

7. The method of claim 6, further comprising:
   a first gap on the third wall at a location relative to an intersection of the first wall and the third wall;
   a second gap on the third wall at a location relative to an intersection of the second wall and the third wall;
   a third gap on the fourth wall at a location relative to an intersection of the first wall and the fourth wall;
   a fourth gap on the fourth wall at a location relative to an intersection of the second wall and the fourth wall;
   wherein each of the first output, the second output, the third output, and the fourth output are electrically connected to one of the first gap, the second gap, the third gap, and the fourth gap to thereby form even and differential excitations between the first wall and the second wall;
   a fifth gap on the first wall at a location relative to a center of the first wall;
   a sixth gap on the second wall at a location relative to a center of the second wall;
   wherein the fifth gap and the sixth gap decouple the third wall and the fourth wall;
   wherein the even and differential excitations between the first wall and the second wall and the decoupled third wall and the decoupled fourth wall form a feeding network;
   wherein the feeding network ensures modes with electric field components along a direction aligned with the third wall and the fourth wall can be excited; and
   wherein an electric field of the modes are symmetric with respect to an axis aligned with the first wall and the second wall and an axis aligned with the third wall and the fourth wall.

8. The method of claim 1, wherein the power divider is a power divider comprising a first output, a second output, a third output, and a fourth output;
   wherein the first output is electrically connected to a first strip;
   wherein the second output is electrically connected to a second strip;
   wherein the third output is electrically connected to a third strip; and
   wherein the fourth output is electrically connected to a fourth strip.

9. The method of claim 8, wherein the first strip, the second strip, the third strip, and the fourth strip are distributed side-by-side across the base area and spaced apart one from another, thereby forming a feeding network that generates a uniform electric field distribution in a depth direction of the electric field generator to thereby form a double layered configuration for lead pathways; and
   wherein the uniform electric field distribution can form validation pathways on a top region and a bottom region.

* * * * *